(12) United States Patent
Ahn et al.

(10) Patent No.: US 7,489,379 B2
(45) Date of Patent: Feb. 10, 2009

(54) LIQUID CRYSTAL DISPLAY DEVICE AND FABRICATING METHOD THEREOF

(75) Inventors: Byung Chul Ahn, Anyang-si (KR); Byung Ho Park, Pohang-si (KR); Jong Hyun Park, Busan (KR)

(73) Assignee: LG Display Co., Ltd., Seoul (KR)

( * ) Notice: Subject to any disclaimer, the term of this patent is extended or adjusted under 35 U.S.C. 154(b) by 635 days.

(21) Appl. No.: 11/270,581

(22) Filed: Nov. 10, 2005

(65) Prior Publication Data

US 2006/0139502 A1 Jun. 29, 2006

(30) Foreign Application Priority Data

Dec. 24, 2004 (KR) ...................... 10-2004-0112587

(51) Int. Cl.
*G02F 1/1343* (2006.01)

(52) U.S. Cl. ......................................... 349/139; 349/43

(58) Field of Classification Search .................. 349/43, 349/139
See application file for complete search history.

(56) References Cited

U.S. PATENT DOCUMENTS

| | | | |
|---|---|---|---|
| 5,162,933 A | 11/1992 | Kakuda et al. | |
| 5,317,433 A | 5/1994 | Miyawaki et al. | |
| 5,339,181 A | 8/1994 | Kim et al. | |
| 5,462,887 A | 10/1995 | Glück | |
| 5,668,379 A | 9/1997 | Ono et al. | |
| 5,731,856 A | 3/1998 | Kim et al. | |
| 5,771,083 A | 6/1998 | Fujihara et al. | |
| 5,793,460 A | 8/1998 | Yang | |
| 5,847,781 A | 12/1998 | Ono et al. | |
| 5,995,177 A * | 11/1999 | Fujikawa et al. | 349/46 |
| 2001/0038429 A1 * | 11/2001 | Baek et al. | 349/113 |

* cited by examiner

*Primary Examiner*—David Nelms
*Assistant Examiner*—Phu Vu
(74) *Attorney, Agent, or Firm*—McKenna Long & Aldridge LLP

(57) ABSTRACT

A liquid crystal display device, including: a gate line on a substrate; a data line crossing the gate line with a gate insulating film in between to define a pixel area; a thin film transistor having a gate electrode connected to the gate line, a source electrode connected to the data line, a drain electrode facing the source electrode, and a semiconductor pattern providing a channel between the source electrode and the drain electrode; and a pixel electrode in the pixel area connected to the drain electrode, wherein the data line, the source electrode, and the drain electrode are formed of a first conductive layer group of double conductive layers, the pixel electrode is formed of the lowermost layer of the extended drain electrode, and the data line, the source electrode, the drain electrode, and the pixel electrode are in an area that is to be sealed by a sealant.

22 Claims, 22 Drawing Sheets

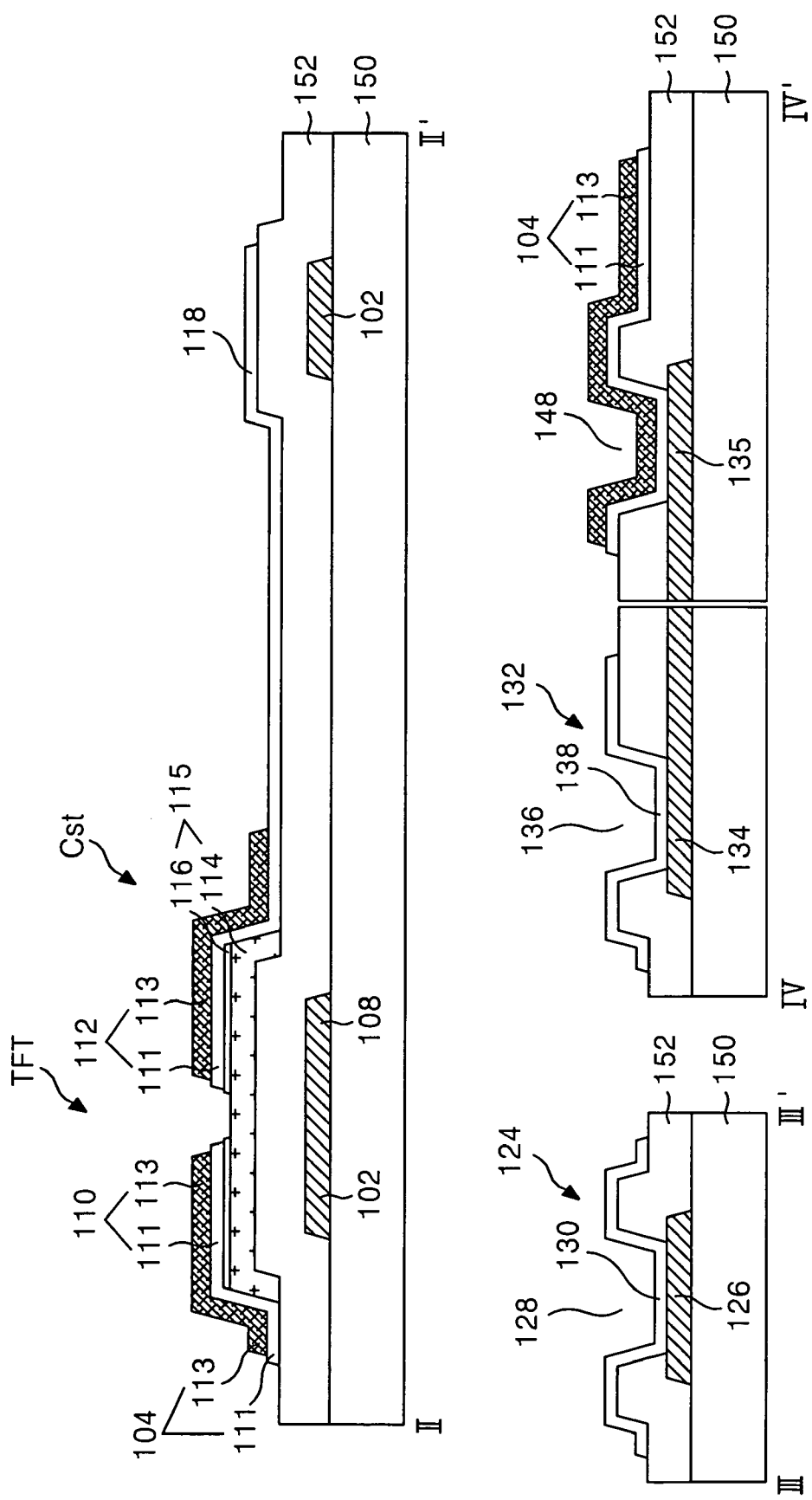

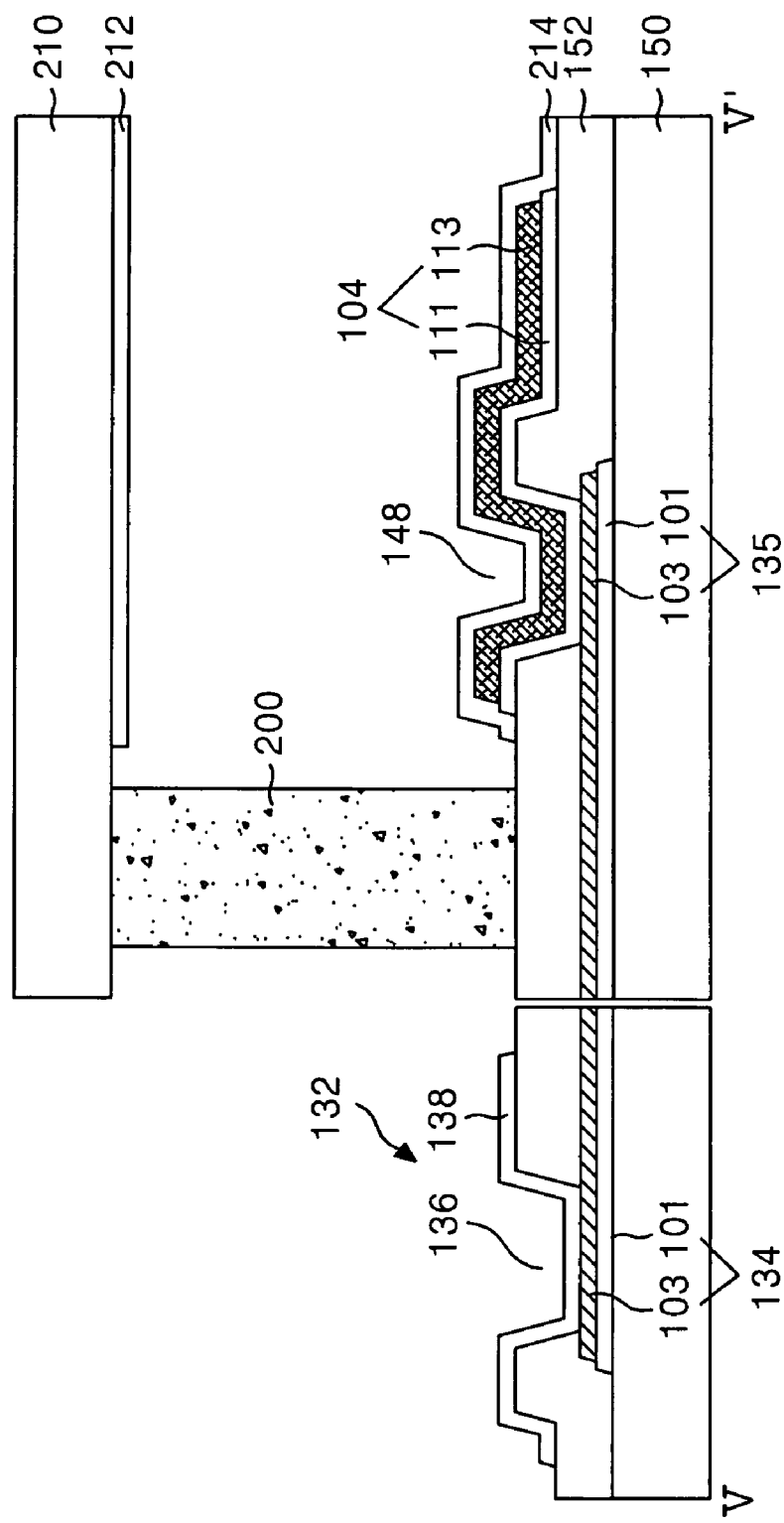

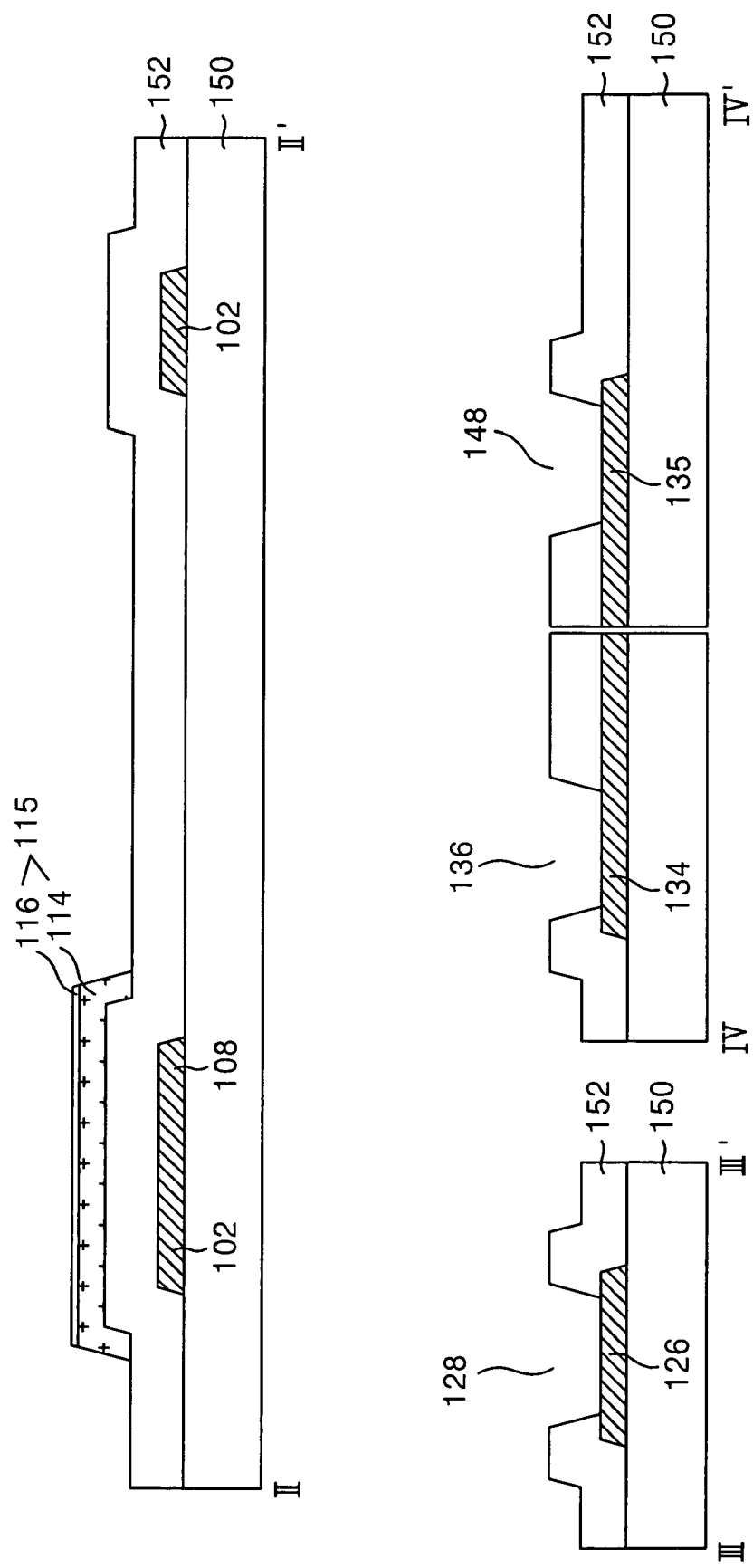

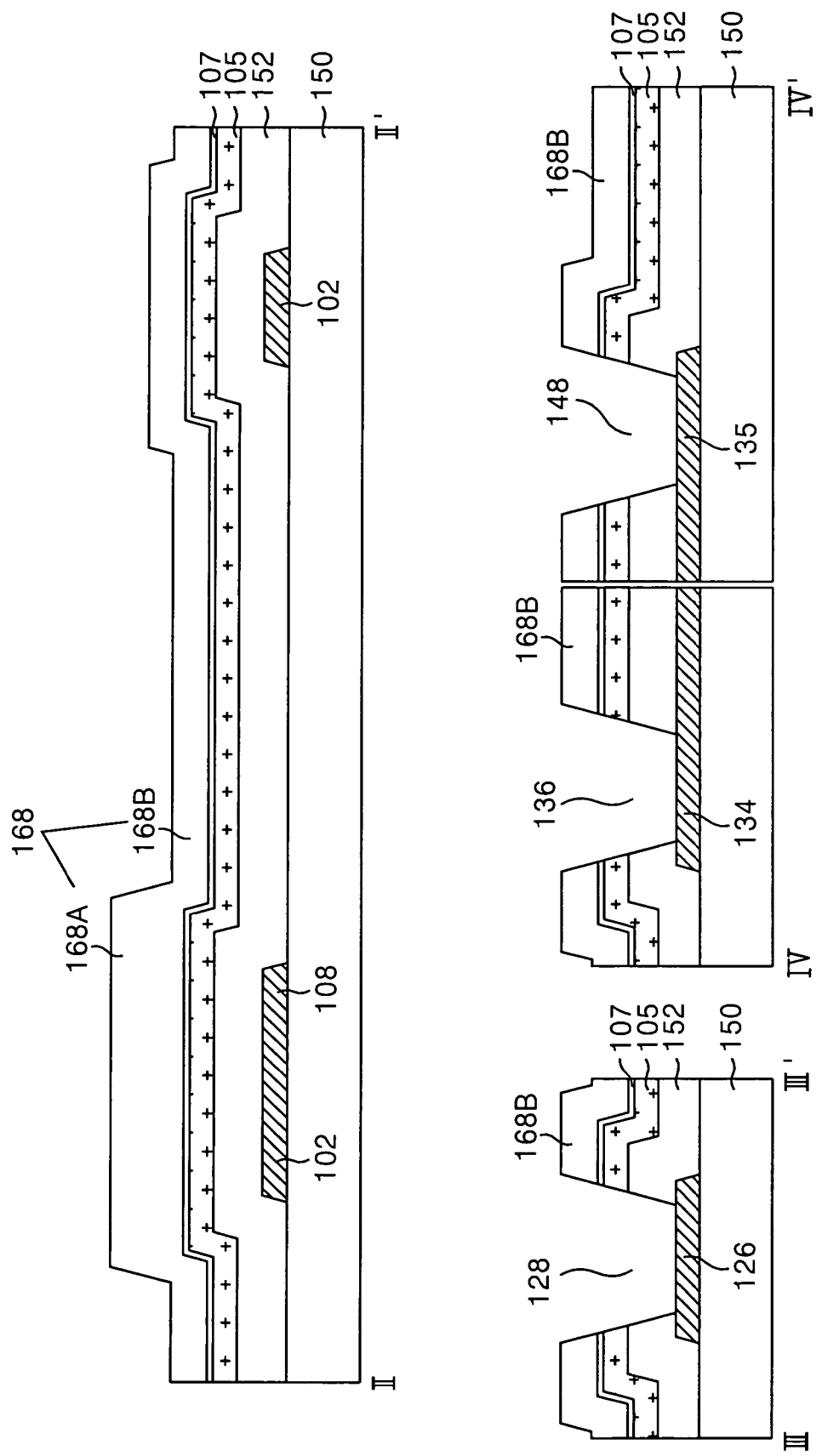

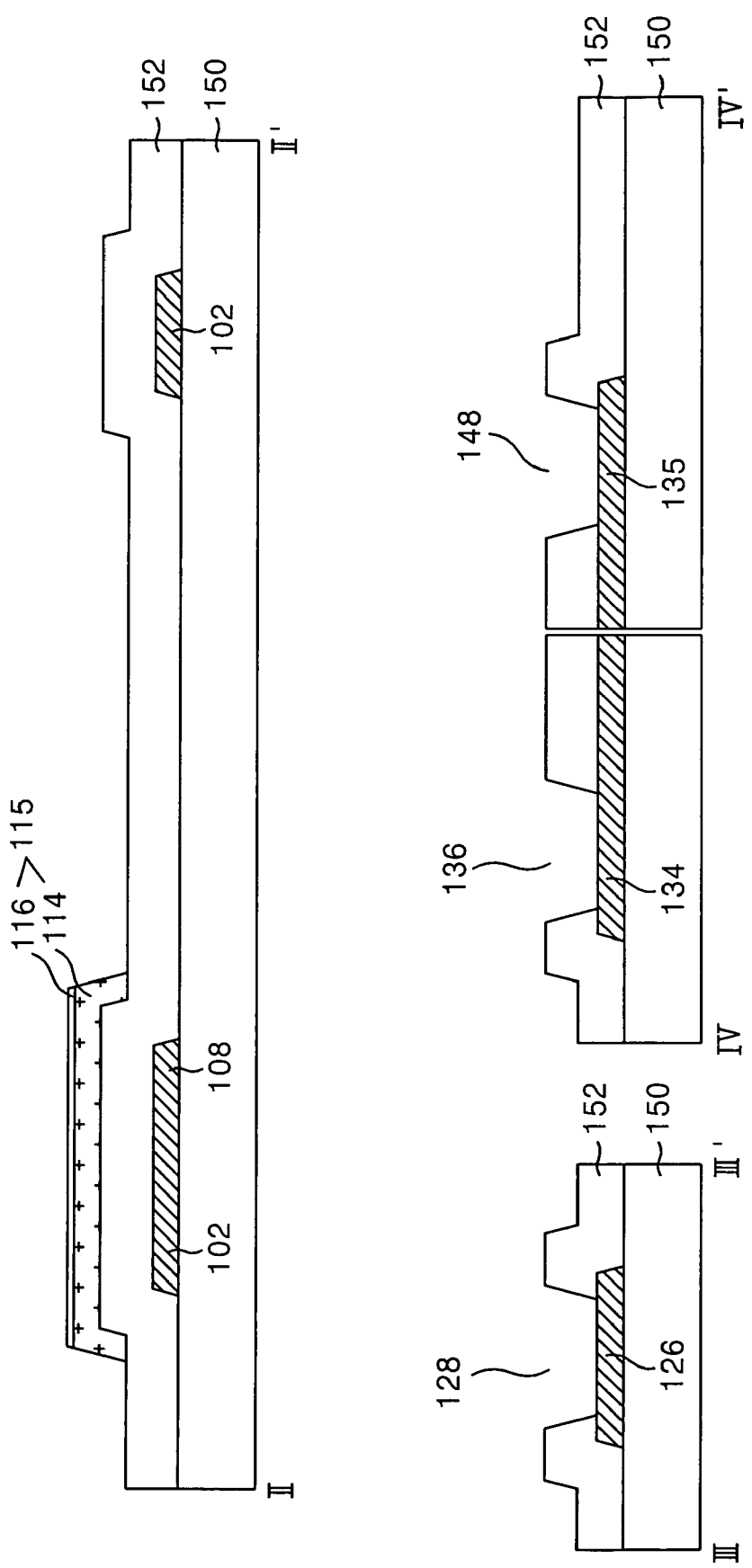

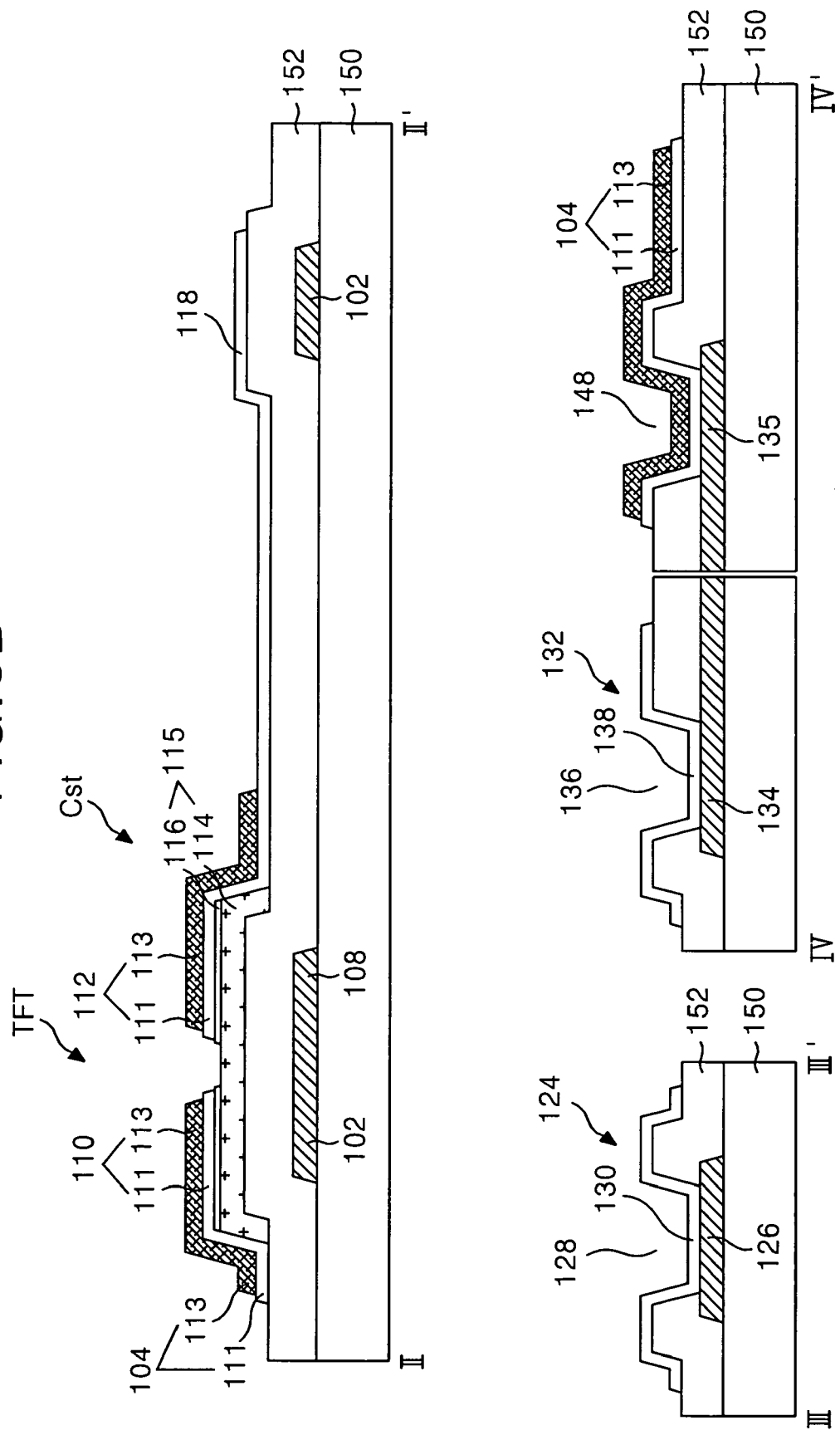

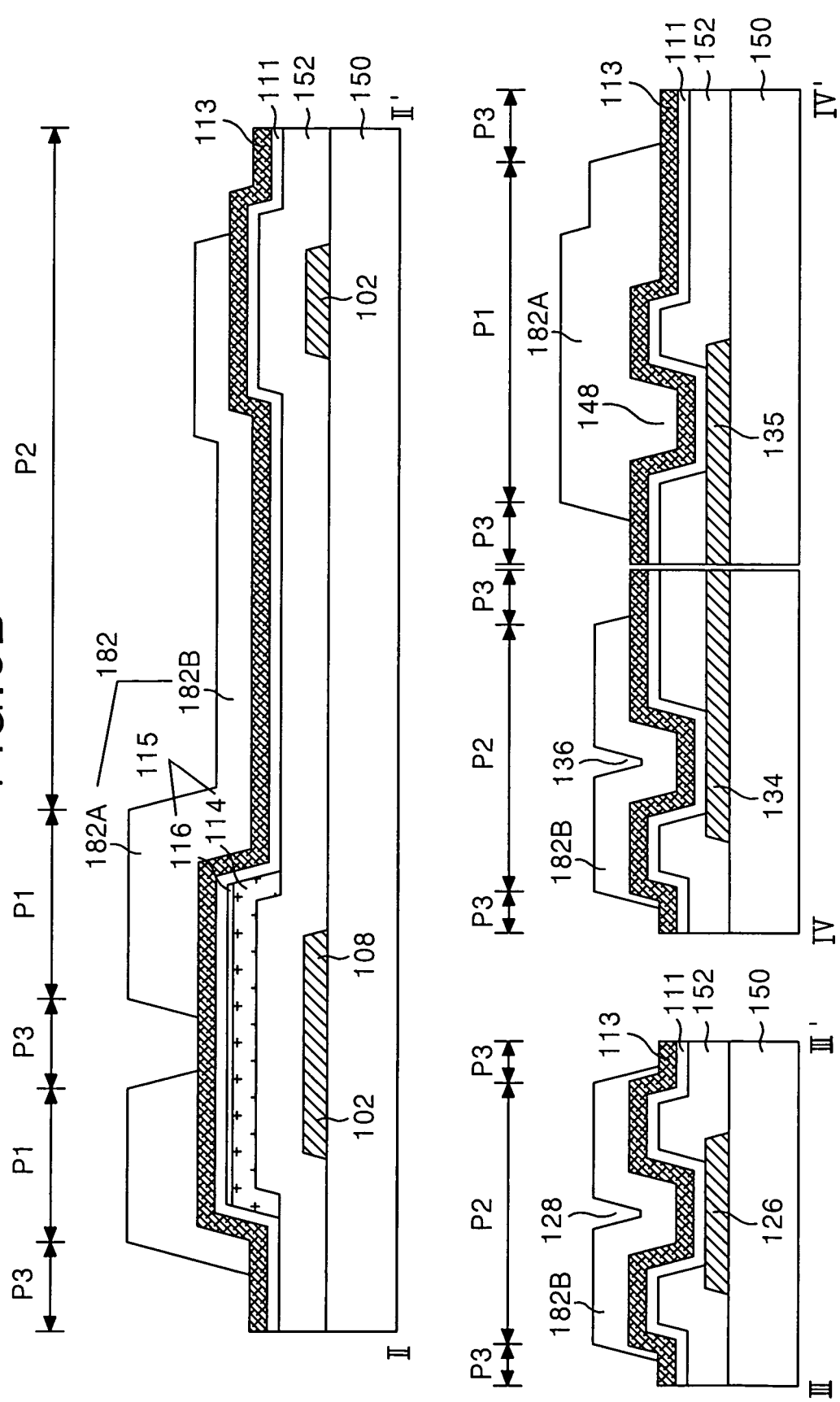

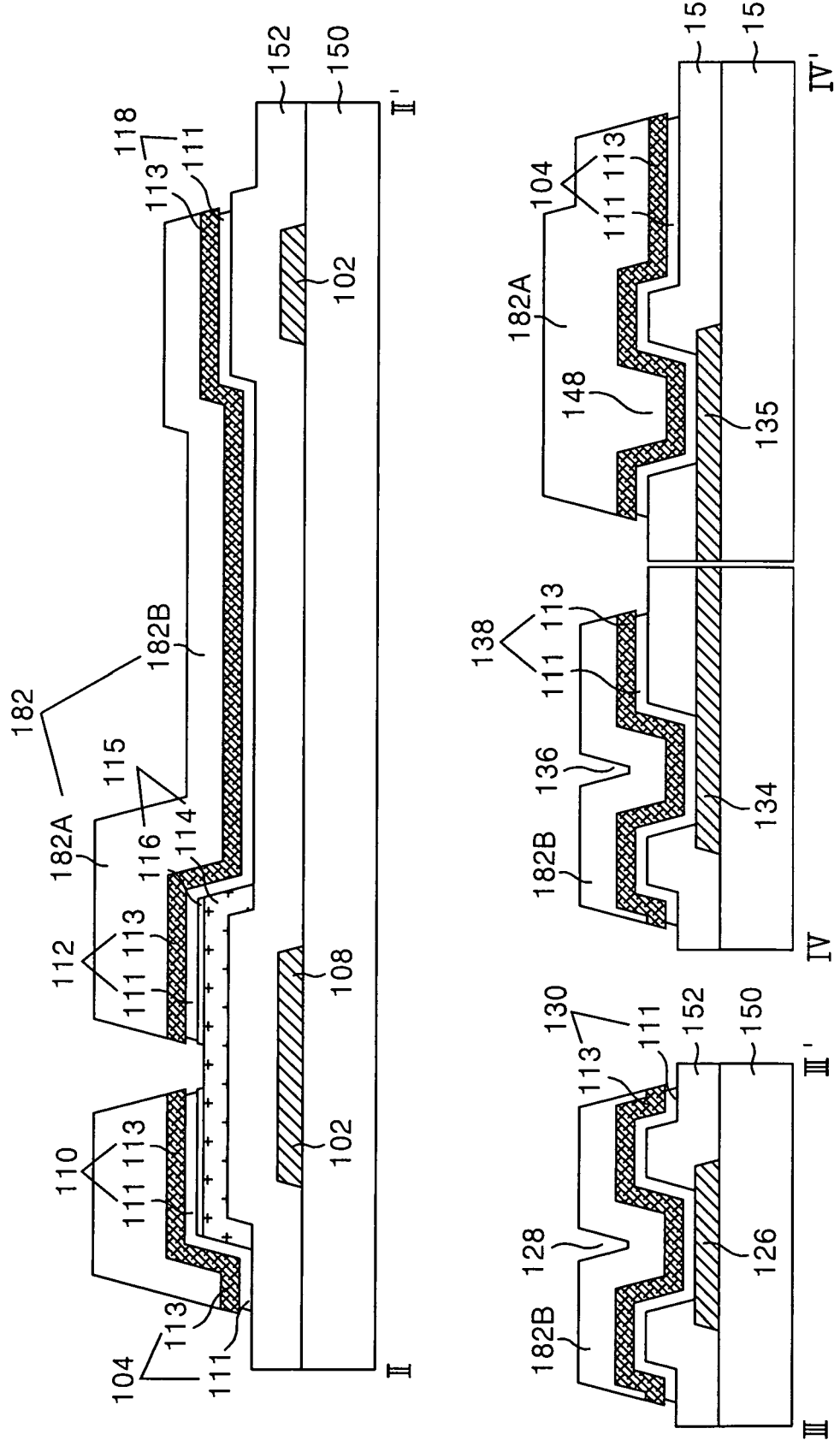

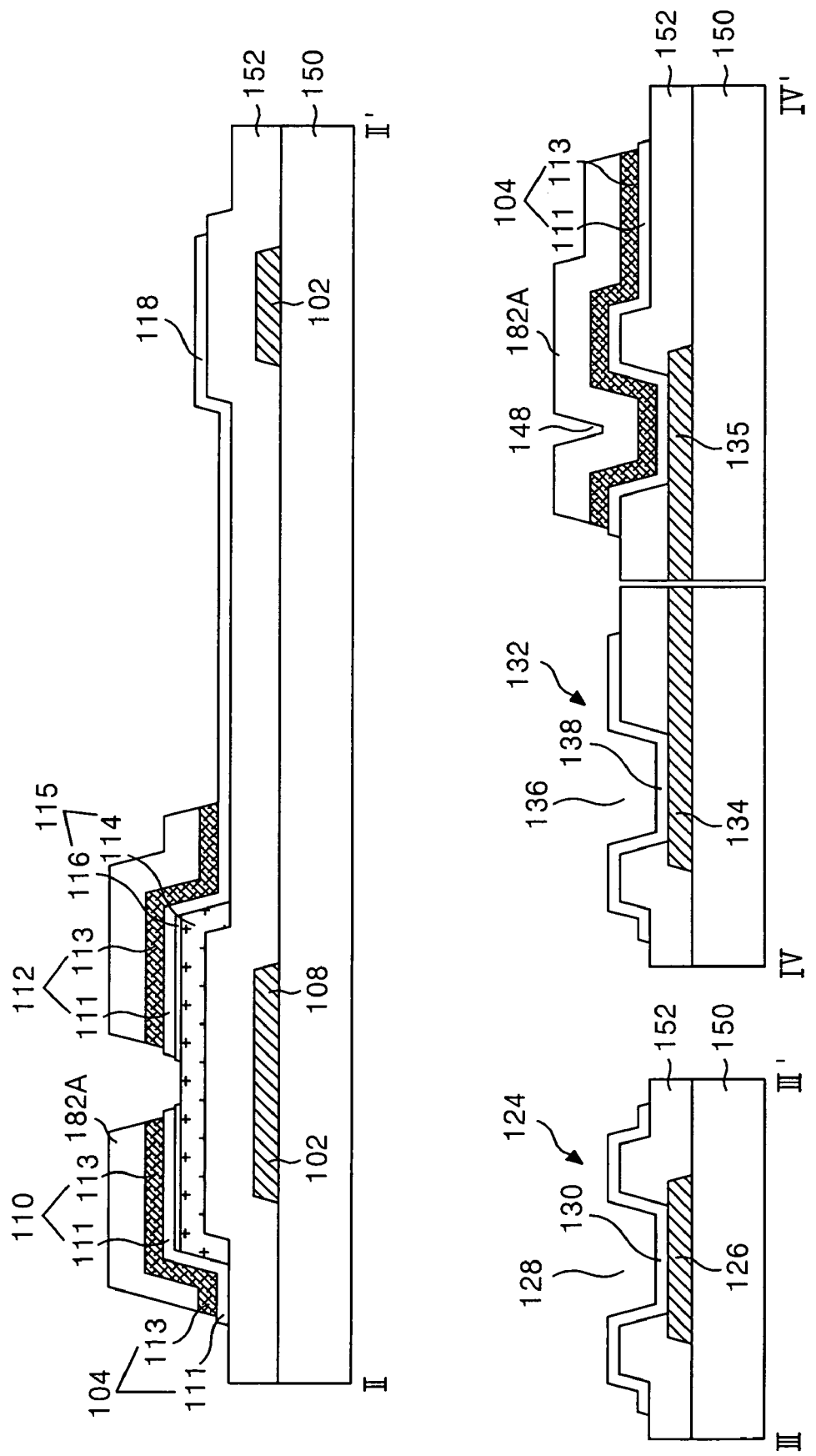

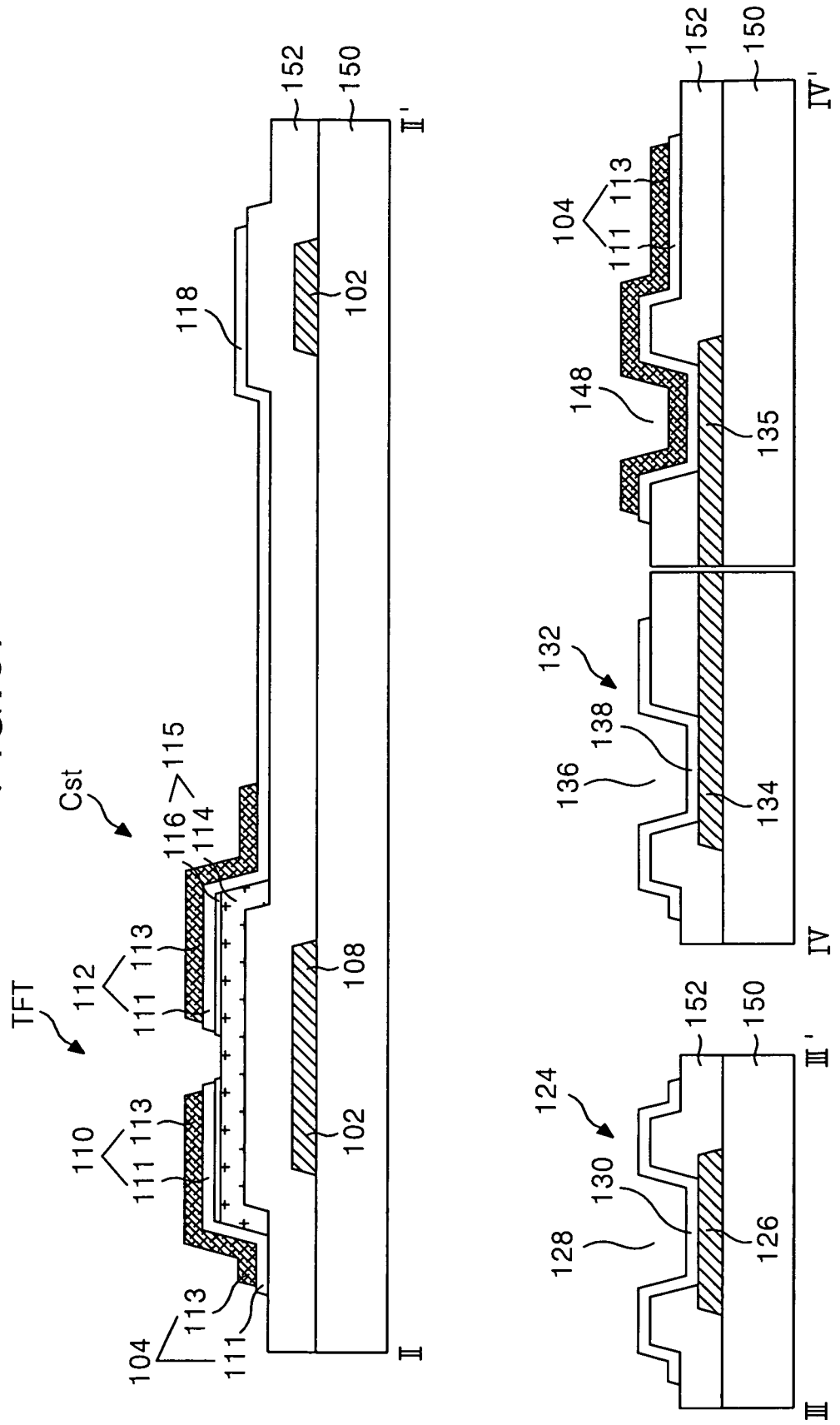

LIQUID CRYSTAL DISPLAY DEVICE AND FABRICATING METHOD THEREOF

This application claims the benefit of the Korean Patent Application No. P2004-112587 filed on Dec. 24, 2004, which is hereby incorporated by reference for all purposes as if fully set forth herein.

BACKGROUND OF THE INVENTION

1. Field of the Invention

The present invention relates to a liquid crystal display device, and more particularly to a thin film transistor substrate that simplifies a fabricating method thereof.

2. Discussion of the Related Art

A liquid crystal display device controls the light transmittance of liquid crystal having dielectric anisotropy by use of an electric field, thereby displaying a picture. The liquid crystal display device includes a liquid crystal display panel for displaying picture through a liquid crystal cell matrix and a drive circuit to drive the liquid crystal display panel.

Referring to FIG. 1, a liquid crystal display panel of the related art includes a color filter substrate 10 and a thin film transistor substrate 20 which are bonded together with a liquid crystal 24 therebetween.

The color filter substrate 10 includes a black matrix 4, a color filter 6, and a common electrode 8 which are sequentially formed on an upper glass substrate 2. The black matrix 4 is formed in a matrix shape on the upper glass substrate 2. The black matrix 4 divides an area of the upper glass substrate into a plurality of cell areas where the color filter is to be formed, and prevents light interference between adjacent cells and external light reflection. The color filter 6 has red R, green G, and blue B areas to transmit each of the red, green, and blue lights. The common electrode 8 is formed of a transparent conductive layer formed over the entire surface of the color filter 6 to supply a common voltage Vcom when driving the liquid crystal 24. In order to provide a level surface over the color filter 6, an overcoat layer (not shown) is formed between the color filter 6 and the common electrode 8.

The thin film transistor substrate 20 includes a thin film transistor 18 and a pixel electrode 22 that are formed in each cell area defined by the crossing of the gate line 14 and the data line 16 on a lower glass substrate 12. The thin film transistor 18 supplies a data signal from the data line 16 to the pixel electrode 22 in response to a gate signal from the gate line 12. The pixel electrode 22 formed of a transparent conductive layer supplies the data signal from the thin film transistor 18 to drive the liquid crystal 24.

The liquid crystal 24 having a dielectric anisotropy rotates in accordance with an electric field formed by the data signal of the pixel electrode 22 and the common voltage Vcom of the common electrode 8 to control the light transmittance, thereby realizing a gray level.

The liquid crystal display panel further includes a spacer (not shown) for uniformly maintaining a cell gap between the color filter substrate 10 and the thin film transistor substrate 20. A ball spacer or a column spacer may be used as the spacer.

The color filter substrate 10 and the thin film transistor substrate 20 of the liquid crystal display panel are formed using a plurality of mask processes. One mask process includes a plurality of processes such as a thin film deposition (coating) process, a cleaning process, a photolithography process (hereinafter, referred to as "photo process"), an etching process, a photo-resist peeling process, and an inspection process.

The thin film transistor substrate includes a semiconductor process and requires a plurality of mask processes, thus its fabricating process is complicated and it becomes a major component of the manufacturing cost of the liquid crystal display panel. Accordingly, a thin film transistor substrate has been developed to reduce the number of mask processes from five mask processes.

SUMMARY OF THE INVENTION

Accordingly, the present invention is directed to a liquid crystal display device and fabricating method thereof that substantially obviates one or more of the problems due to limitations and disadvantages of the related art.

An advantage of the present invention is to provide a thin film transistor substrate that is adaptive for simplifying process, and a fabricating method thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display device, including: a gate line on a substrate; a data line crossing the gate line with a gate insulating film in between to define a pixel area; a thin film transistor having a gate electrode connected to the gate line, a source electrode connected to the data line, a drain electrode facing the source electrode, and a semiconductor pattern providing a channel between the source electrode and the drain electrode; and a pixel electrode in the pixel area connected to the drain electrode, wherein the data line, the source electrode, and the drain electrode are formed of a first conductive layer group of double conductive layers, the pixel electrode is formed of the lowermost layer of the extended drain electrode, and the data line, the source electrode, the drain electrode, and the pixel electrode are in an area that is to be sealed by a sealant.

In another aspect of the present invention, a method of fabricating a liquid crystal display device, including: a first mask process of forming a first mask pattern group having a gate line and a gate electrode connected to the gate line on a substrate; a second mask process of forming a gate insulating film to cover the first mask pattern group and a semiconductor pattern thereon; and a third mask process of forming a third mask pattern group having a data line, a source electrode connected to the data line, a drain electrode facing the source electrode, and a pixel electrode on the gate insulating film where the semiconductor pattern is formed, so that the third mask pattern group is located in an area sealed by a sealant, wherein the data line, the source electrode, and the drain electrode have double conductive layers, and the pixel electrode has a single layer structure where the lowermost layer of the drain electrode is extended.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3 is a cross sectional view representing the thin film transistor substrate shown in FIG. 2, taken along the lines III-III', IV-IV', V-V', VI-VI';

FIG. 4 is a cross sectional view illustrating a data pad area in a liquid crystal display panel by use of the thin film transistor substrate shown in FIG. 3;

FIGS. 6A and 6B are a plan view and a cross sectional view for explaining a second mask process in a fabricating method of the thin film transistor substrate according to the embodiment of an present invention;

FIGS. 7A to 7F are cross sectional diagrams for specifically explaining the second mask process of the present invention;

FIGS. 8A and 8B are a plan view and a cross sectional view for explaining a third mask process in a fabricating method of the thin film transistor substrate according to an embodiment of the present invention; and FIGS. 9A to 9F are cross sectional diagrams for specifically explaining the third mask process of the present invention.

DETAILED DESCRIPTION OF THE ILLUSTRATED EMBODIMENT

Reference will now be made in detail to the preferred embodiments of the present invention, examples of which are illustrated in the accompanying drawings.

With reference to FIGS. 2 to 9F, embodiments of the present invention will be explained as follows.

Figure 1:
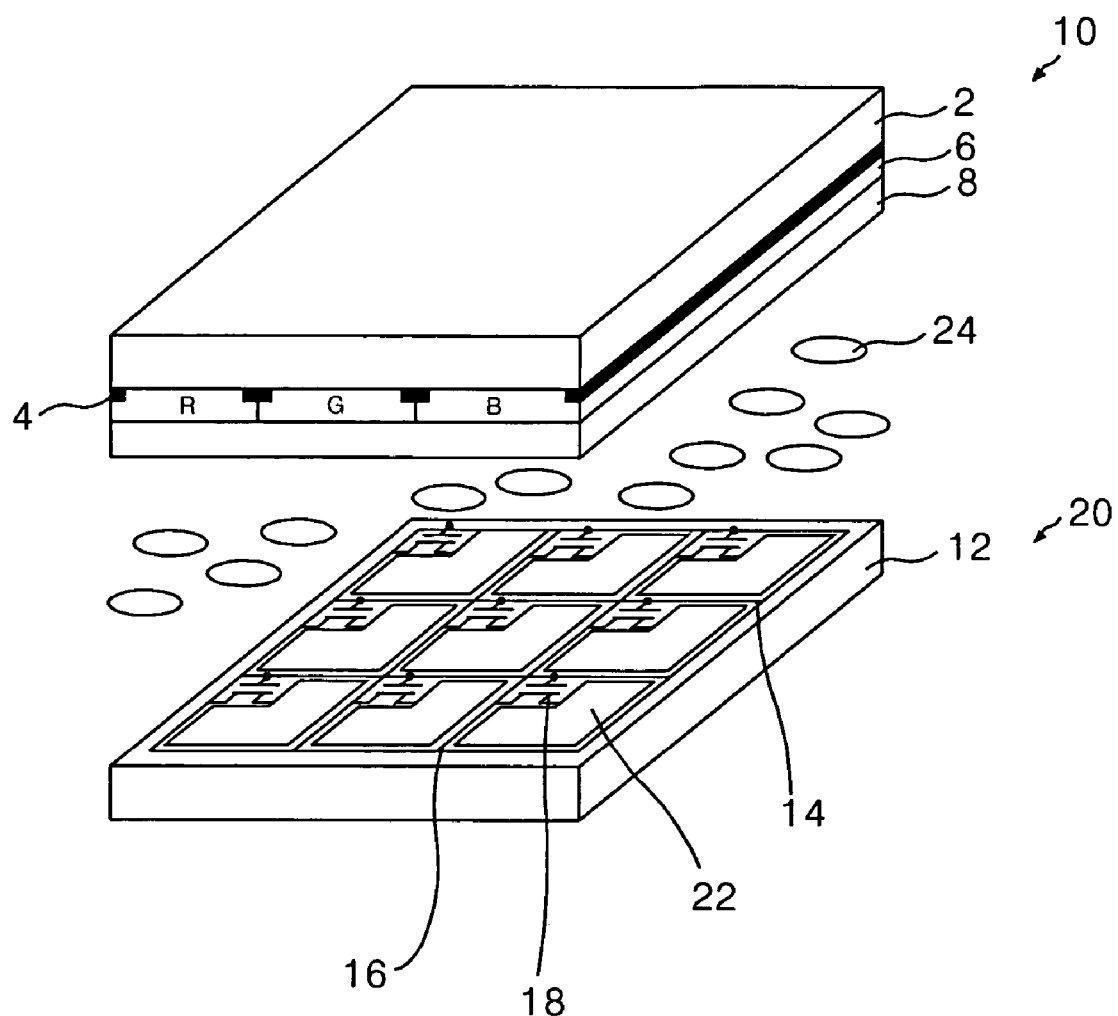
FIG. 1 is a perspective view illustrating a liquid crystal display panel structure of the related art.
Figure 2:
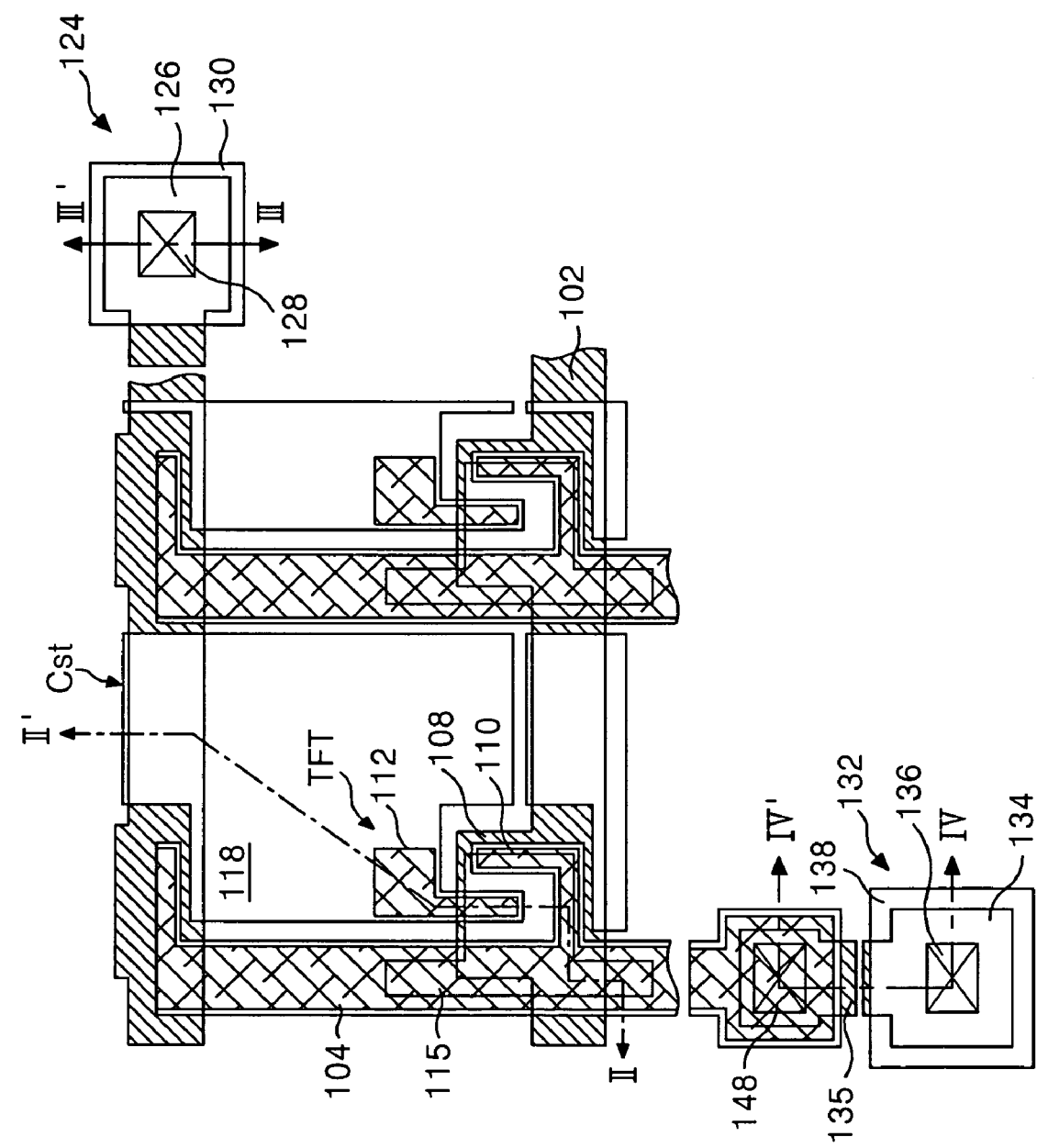
FIG. 2 is a plan view illustrating a thin film transistor substrate according to an embodiment of the present invention.

FIG. 2 is a plan view illustrating a thin film transistor substrate according to an embodiment of the present invention, and FIG. 3 is a cross-sectional view illustrating the thin film transistor substrate shown in FIG. 2, taken along the lines III-III', IV-IV', V-V', VI-VI'.

The thin film transistor substrate shown in FIGS. 2 and 3 includes: a gate line 102 and a data line 104 that are formed on a lower substrate 150 crossing each other with a gate insulating film 152 therebetween to define a pixel area; a thin film transistor TFT connected to the gate line 102, the data line 104, and a pixel electrode 118; and the pixel electrode 118 connected to the thin film transistor TFT; and a storage capacitor Cst formed at an overlapping part of the pixel electrode 118 and the pre-stage gate line 102. The thin film transistor substrate further includes a gate pad 124 connected to the gate line 102 and a data pad 132 connected to the data line.

The gate line 102 supplies a scan signal from a gate driver (not shown), and the data line 104 supplies a video signal from a data driver (not shown). The gate line 102 and the data line 104 cross each other with a gate insulating film 152 therebewteen to define each pixel area.

The gate line 102 and the data line 104 are formed in a double layer structure having at least double conductive layers. Specially, the data line 104 is formed in a double layer structure having a transparent conductive layer. For example, the data line 104, as shown in FIG. 3, is formed in a double layer structure where a first conductive layer 111 is a transparent conductive layer and a second conductive layer 113 is an opaque metal. In this case, the first conductive layer 111 may be formed of ITO, TO, IZO, ITZO, etc. and the second conductive layer 113 may be formed of a metal material such as Mo, Ti, Cu, Al, Cr, Mo alloy, Cu alloy, Al alloy, etc. in a single layer or a multiple layer structure.

The thin film transistor TFT receives a video signal from the data line 104 to be charged and stored on the pixel electrode 118 in response to a scan signal on the gate line 102. The thin film transistor TFT includes: a gate electrode 108 connected to the gate line 102; a source electrode 110 connected to the data line 104; a drain electrode 112 that faces the source electrode 110 and connects to the pixel electrode 118; and a semiconductor pattern 115 that overlaps the gate electrode 108 with a gate insulating film 152 therebetween to form a channel between the source electrode 110 and the drain electrode 112. The source electrode 110 and the drain electrode 112 are formed together with the data line 104 in a double layer structure when first and second conductive layers 111, 113 are deposited. The semiconductor pattern 115 includes an active layer 114 which forms a channel between the source electrode 110 and the drain electrode 112, and an ohmic contact layer 116 formed on the active layer 114, except in a channel area in ohmic contact with the source electrode 110 and the drain electrode 112.

The pixel electrode 118 connected to the drain electrode 112 is formed in the pixel area defined by the crossing of the gate line 102 and the data line 104. The pixel electrode 118 is formed of a first conductive layer 111, i.e., a transparent conductive layer that extends from the drain electrode 112. The pixel electrode 118 is charged with the pixel signal supplied from the thin film transistor TFT that generates a potential difference with a common electrode that is on a color filter substrate (not shown). The potential difference causes a liquid crystal, which is located between the thin film transistor substrate and the color filter substrate, to rotate due to dielectric anisotropy, thereby controlling the amount of light passing through the pixel electrode 118 to then pass through the color filter substrate.

The storage capacitor Cst is formed by the pixel electrode 118 overlapping the pre-stage gate line 102 with the gate insulating film 152 therebetween. The pixel electrode 118 is formed to extend from the pixel area to encompass the pre-stage gate line 102. By the storage capacitor Cst, the video signal charged on the pixel electrode 118 can be stably stored until the next signal is charged.

The gate line 102 receives a scan signal from a gate driver (not shown) through a gate pad 124. The gate pad 124 includes a gate pad lower electrode 126 extending from the gate line 102; and a gate pad upper electrode 130 connected to the gate pad lower electrode 126 through a first contact hole 128 that penetrates the gate insulating film 126.

The data line 104 receives a pixel signal from a data driver (not shown) through a data pad 132. The data pad 132 includes a data pad lower electrode 134 connected to a data link 105; and a data pad upper electrode 138 connected to the data pad lower electrode 134 through a second contact hole 136 that penetrates the gate insulating film 152.

The data pad 132 is formed in the same structure as the gate pad 124. Specifically, the gate pad lower electrode 126, the data pad lower electrode 134 and the data link 135 are formed together with the gate line 102 on a substrate. Further, the gate pad upper electrode 130 and the data pad upper electrode 138 together with the data line 104 are formed from the first conductive layer 111, i.e., the transparent conductive layer, on the gate insulating film 152.

Accordingly, the data link 135 formed on the substrate 150 is connected to the data line 104 through a third contact hole 48 that penetrates the gate insulating film 152. The data line 104 is exposed due to the absence of a passivation film. In order to prevent the data line 104 from being exposed and oxidized, the third contact hole 148 is located in an area which is sealed by a sealant 200, as shown in FIG. 4. Accordingly, the data line 104 that is located in the sealing area is protected by a lower alignment film 214 that is spread thereover.

Specifically, the thin film transistor substrate over which the lower alignment film 214 is formed and a color filter substrate 210 over which the upper alignment film 212 is formed, as shown in FIG. 4, are bonded by the sealant 200, and a cell gap between the two substrates that are sealed by the sealant 200 is filled with liquid crystal. The upper and lower alignment films 212, 214 are formed by forming an organic insulating material over each picture display area of the two substrates. The sealant 200 is formed to be separate from and not in contact with the upper and lower alignment films 212, 214 in order to reinforce the adhesive strength. Accordingly, the data line 104, the source electrode 110, the drain electrode 112, and the pixel electrode 118 that are formed on the thin film transistor substrate are located in an area that is to be sealed by the sealant 200, thereby being sufficiently protected by the liquid crystal filled in the sealing area as well as by the lower alignment film 214 spread thereon. In this way, the thin film transistor substrate of the present invention without a passivation film is formed using three mask processes as follows.

Figure 5A:
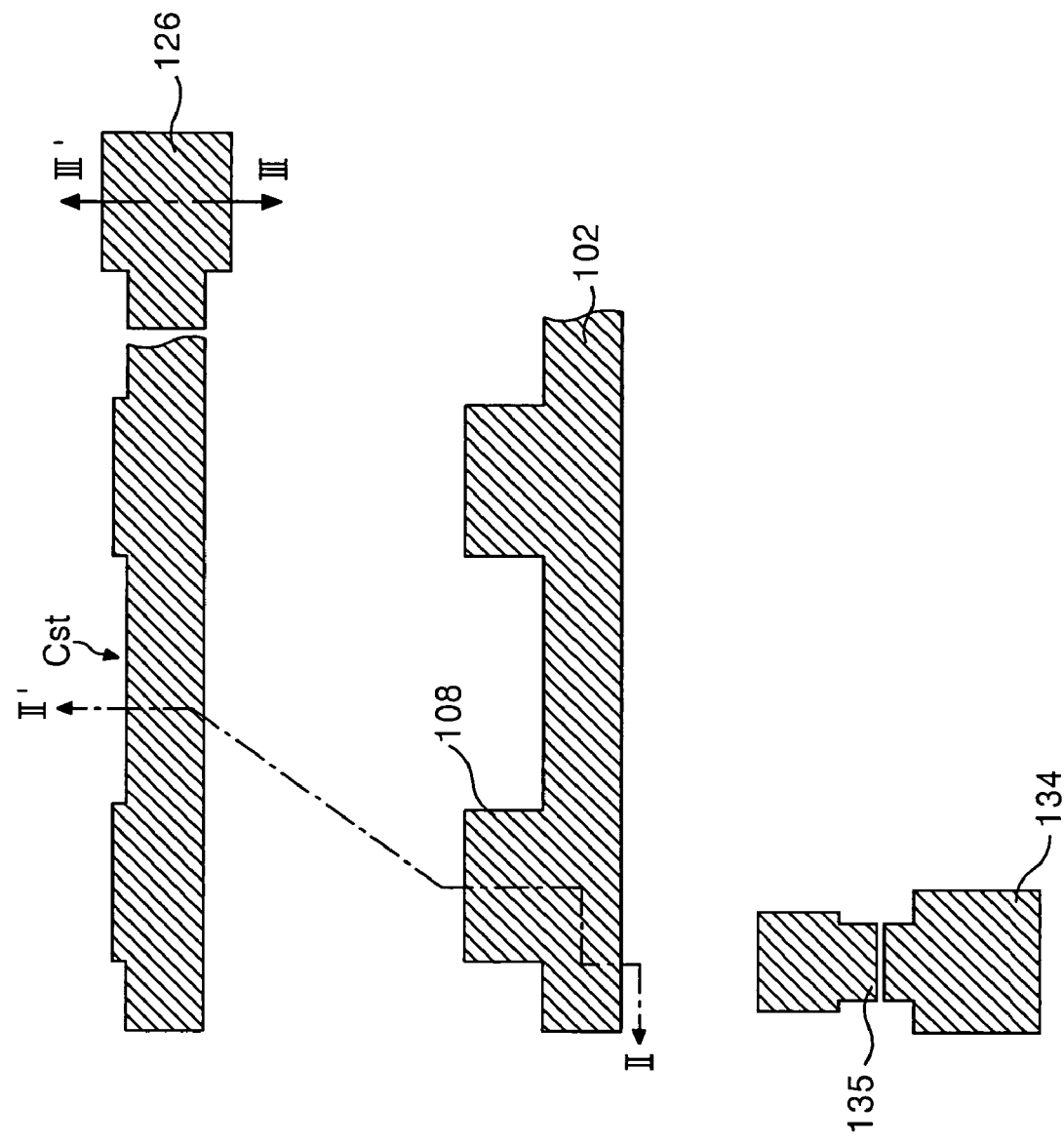
FIGS. 5A and 5B are a plan view and a cross sectional view for explaining a first mask process in a fabricating method of the thin film transistor substrate according to the embodiment of an present invention.
Figure 5B:
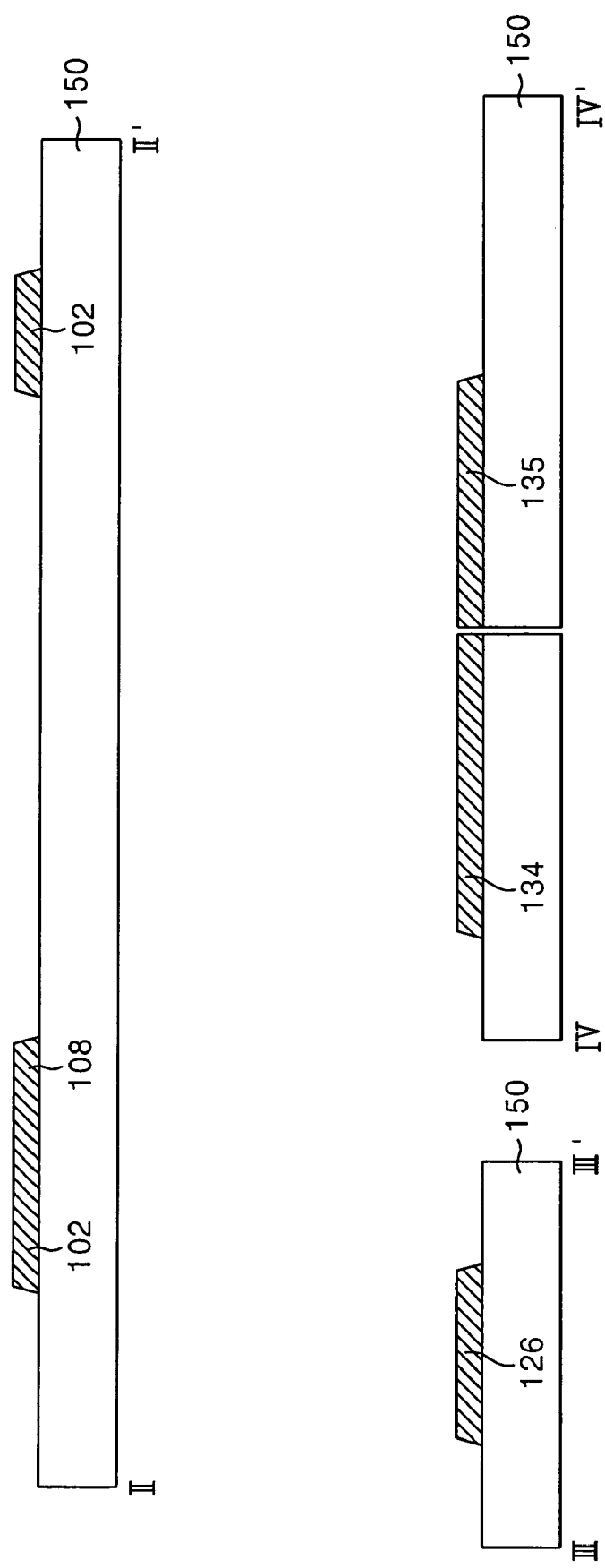

FIGS. 5A and 5B illustrate a plan view and a cross sectional view for explaining a first mask process in a fabricating method of a thin film transistor substrate according to an embodiment of the present invention.

A first mask pattern group including the gate line 102, the gate electrode 108, the gate pad lower electrode 126, the data link 135, and the data pad lower electrode 134 is formed on a lower substrate 150 by the first mask process.

Specifically, a gate metal layer is formed on the lower substrate 150 by a deposition method such as sputtering. The gate metal layer may be formed of Mo, Ti, Cu, AlNd, Al, Cr, Mo alloy, Cu alloy and Al alloy in a single layer, or may be formed in a double or more layer structure like Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, Al alloy/Mo alloy, Mo alloy/Al alloy and Mo/Al alloy. Subsequently, the gate metal layer is patterned by a photolithography process and an etching process using a first mask, thereby forming the first metal pattern group including the gate line 102, the gate electrode 108, the gate pad lower electrode 126, the data link 135, and the data pad lower electrode 136.

Figure 6A:
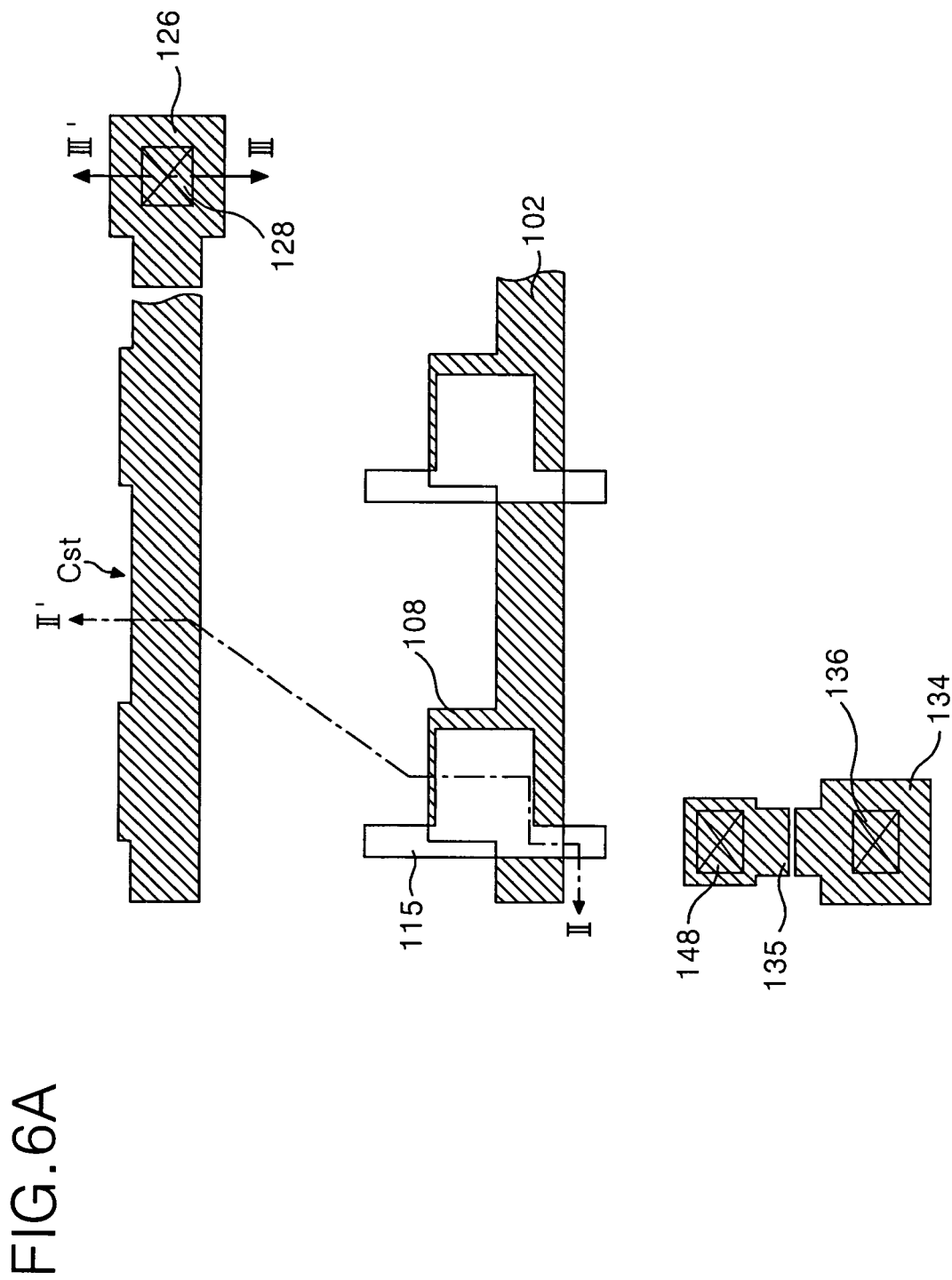
Figure 7A:
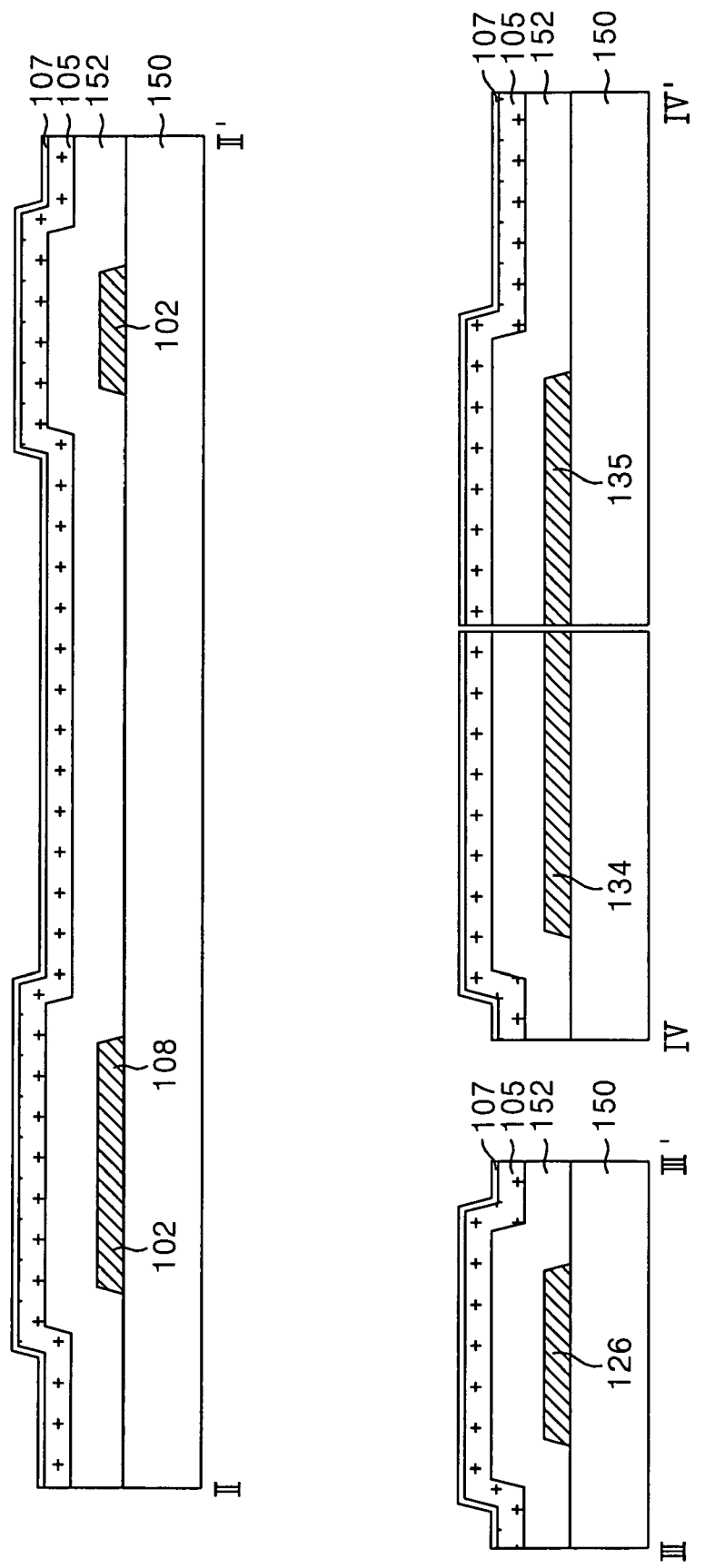
Figure 7B:
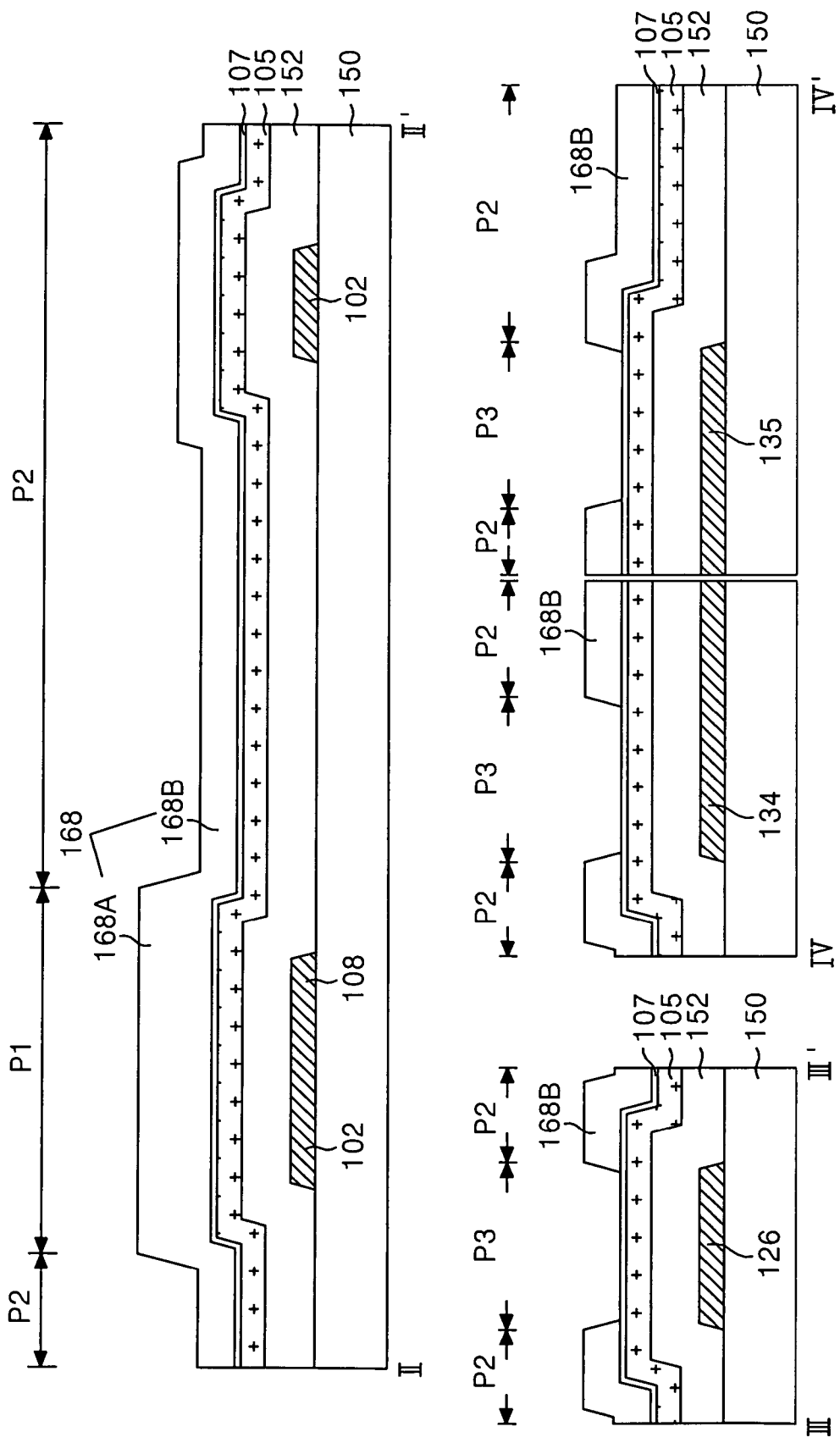
Figure 7D:
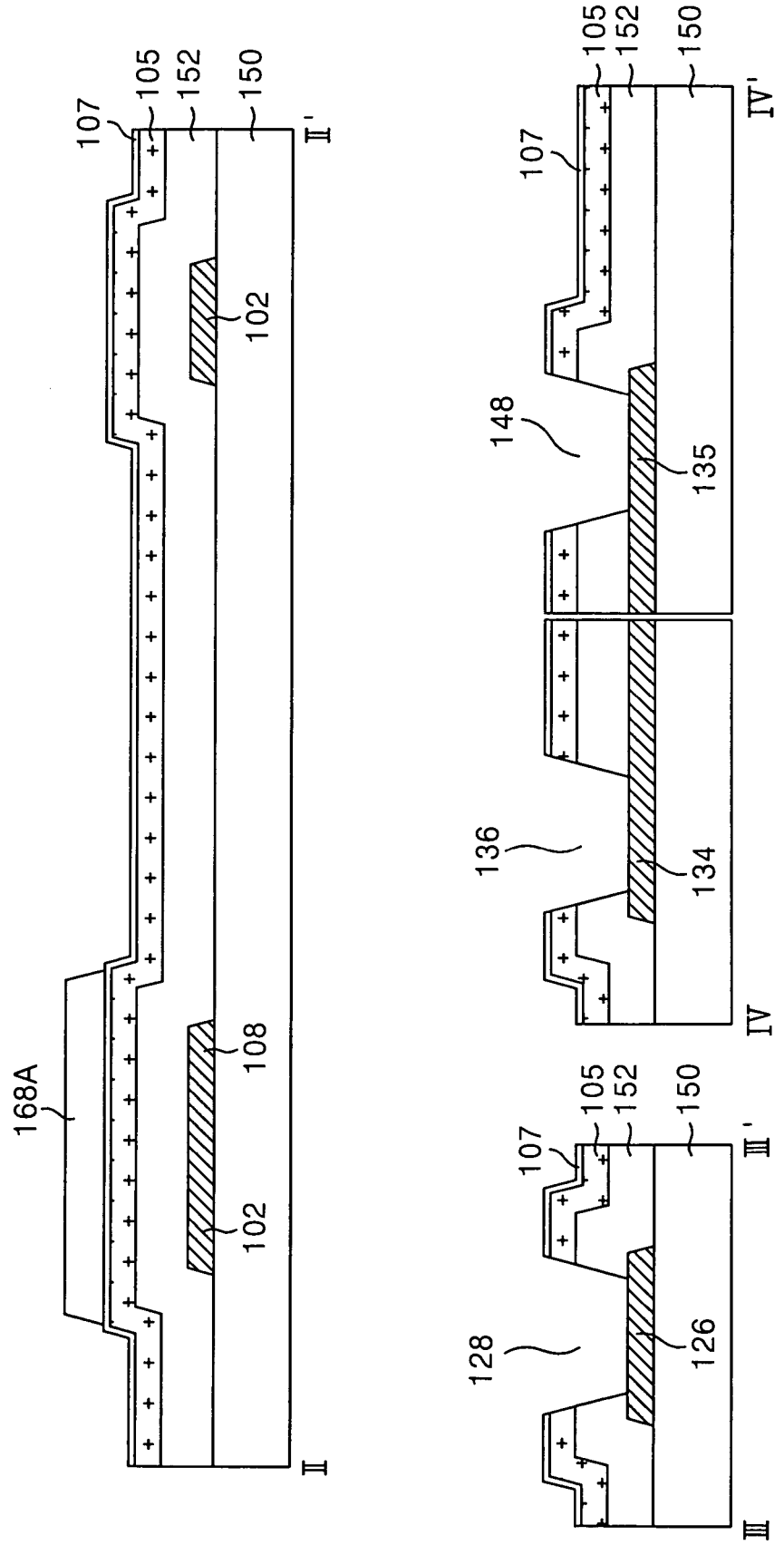
Figure 7E:
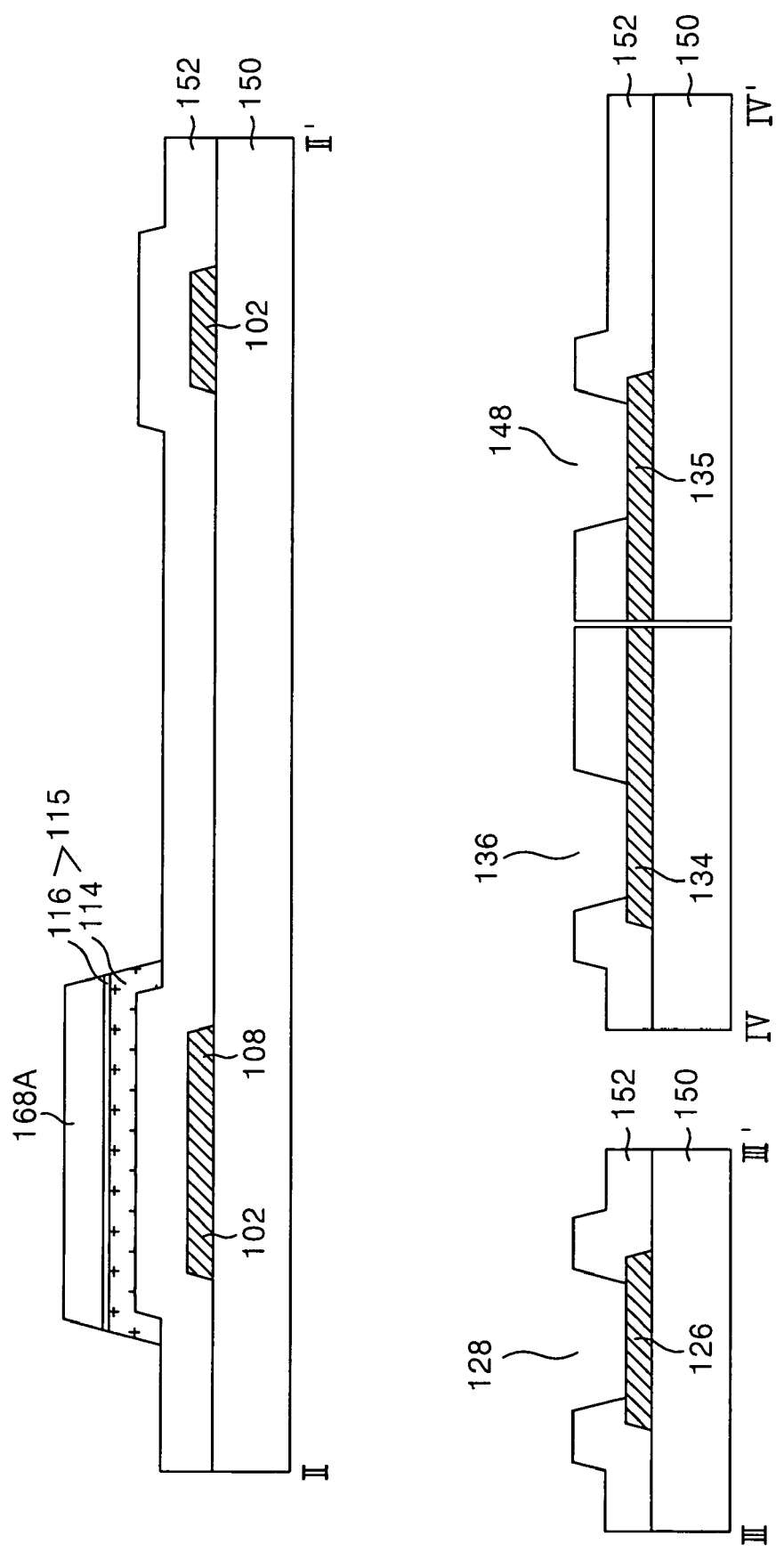

FIGS. 6A and 6B illustrate a plan view and a cross sectional diagram for explaining a second mask process in the fabricating method of the thin film transistor according to an embodiment of the present invention, and FIGS. 7A and 7E illustrate cross sectional diagrams for specifically explaining the second mask process.

The semiconductor pattern 115 and the gate insulating film 152 including the first to third contact holes 128, 136, 148 are formed by the second mask process on the lower substrate 150 where the first mask pattern group is formed. The semiconductor pattern 115 and the contact holes 128, 136, 148 of the gate insulating film 152 are formed by a mask process using a diffractive exposure mask or a halftone mask. Hereinafter, a halftone mask will be used as an example of a second mask.

Referring to FIG. 7A, the gate insulating film 152, an amorphous silicon layer 105, and an amorphous silicon layer 107 doped with impurities (n+ or p+) are sequentially formed on the lower substrate 150 where the first pattern group is formed, by a deposition method such as PECVD. The gate insulating film 152 is formed of an inorganic insulating material such as SiOx, SiNx, etc.

Referring to FIG. 7B, a second photo-resist pattern 168 with a step difference is formed by the photolithography process using the halftone mask. The halftone mask includes a shielding area for intercepting ultraviolet rays; a halftone transmission area for partially transmitting the ultraviolet rays by use of a phase shift material; and a transmission area for transmitting all the ultraviolet rays. There is formed a second photo-resist pattern 168 with an aperture part, which includes photo-resist patterns 168A, 168B having different thicknesses from each other, by the photolithography process using the halftone mask. The relatively thick photo-resist pattern 168A is formed in a shielding area P1 of the second photo-resist which overlaps the shielding part P1 of the halftone mask, the photo-resist pattern 168B which is thinner than the photo-resist pattern 168A is formed in a halftone exposure area P2 which overlaps the halftone transmission area, and the aperture area is formed in a full exposure area P3 that overlaps the transmission part.

Referring to FIG. 7C, there are formed the first to third contact holes 128, 136, 148 that penetrate the amorphous silicon layer 107 doped with the impurities as far as the gate insulating film 152 by an etching process using the second photo-resist pattern 168 as a mask. The first contact hole 128 exposes the gate pad lower electrode 126, the second contact hole 136 exposes the data pad lower electrode 134, and the third contact hole 148 exposes the data link 135.

Referring to FIG. 7D, an ashing process using oxygen plasma O2 thins the photo-resist pattern 168A and removes the photo-resist pattern 168B.

Referring to FIG. 7E, the amorphous silicon layer 107 doped with the impurities and the amorphous silicon layer 125 are patterned by the etching process using the ashed photo-resist pattern 168A as a mask, thereby forming the semiconductor pattern 115 having the active layer 114 and the ohmic contact layer 116.

Referring to FIG. 7F, the photo-resist pattern 168A remaining on the semiconductor pattern 115 is removed using a stripping process.

The process of forming the semiconductor pattern 115 including the first to third contact holes 128, 136, 148, the active layer 114, and the ohmic contact layer 116 using of the first photo-resist pattern 168 as a mask may be performed in one process.

Figure 8A:
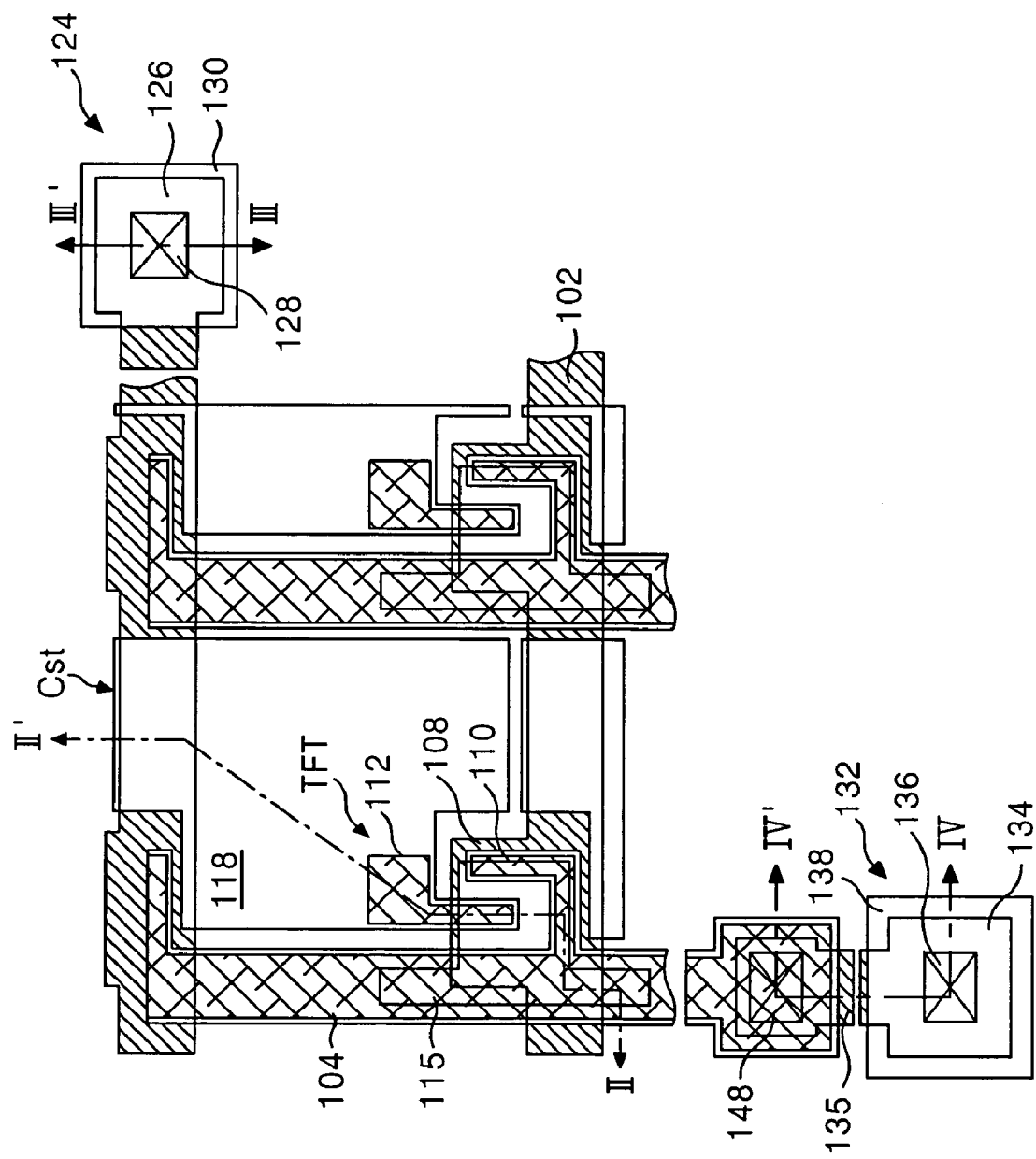

FIGS. 8A and 8B are a plan view and a cross sectional view for explaining a third mask process in the fabricating method of the thin film transistor substrate according to the present invention, and FIGS. 9A to 9E are cross sectional views for specifically explaining the third mask process of the present invention.

Using the third mask process, a third mask pattern group including the data line 104, the source electrode 110, the drain electrode 112, the pixel electrode 118, the gate pad upper electrode 130, and the data pad upper electrode 138 is formed on the gate insulating film 152 where the semiconductor pattern 115 is formed. A mask pattern group having the data line 104, the source electrode 110, and the drain electrode 112 in such a third mask pattern group is formed in a double or multiple layer structure where at least two conductive layers are deposited, but for the sake of convenience, hereinafter only the double structure where the first and second conductive layers 111, 113 are deposited will be explained. A mask pattern group having the pixel electrode 118, the gate pad upper electrode 130, and the data pad upper electrode 138 is formed in a single layer structure from the first conductive layer 111 of the mask pattern group. The third mask pattern group with the double layer structure and the mask pattern group with the single layer structure is formed by the third mask process using the diffractive exposure mask and the halftone mask. Hereinafter, the case using the halftone mask as a third mask will be explained.

Figure 9A:
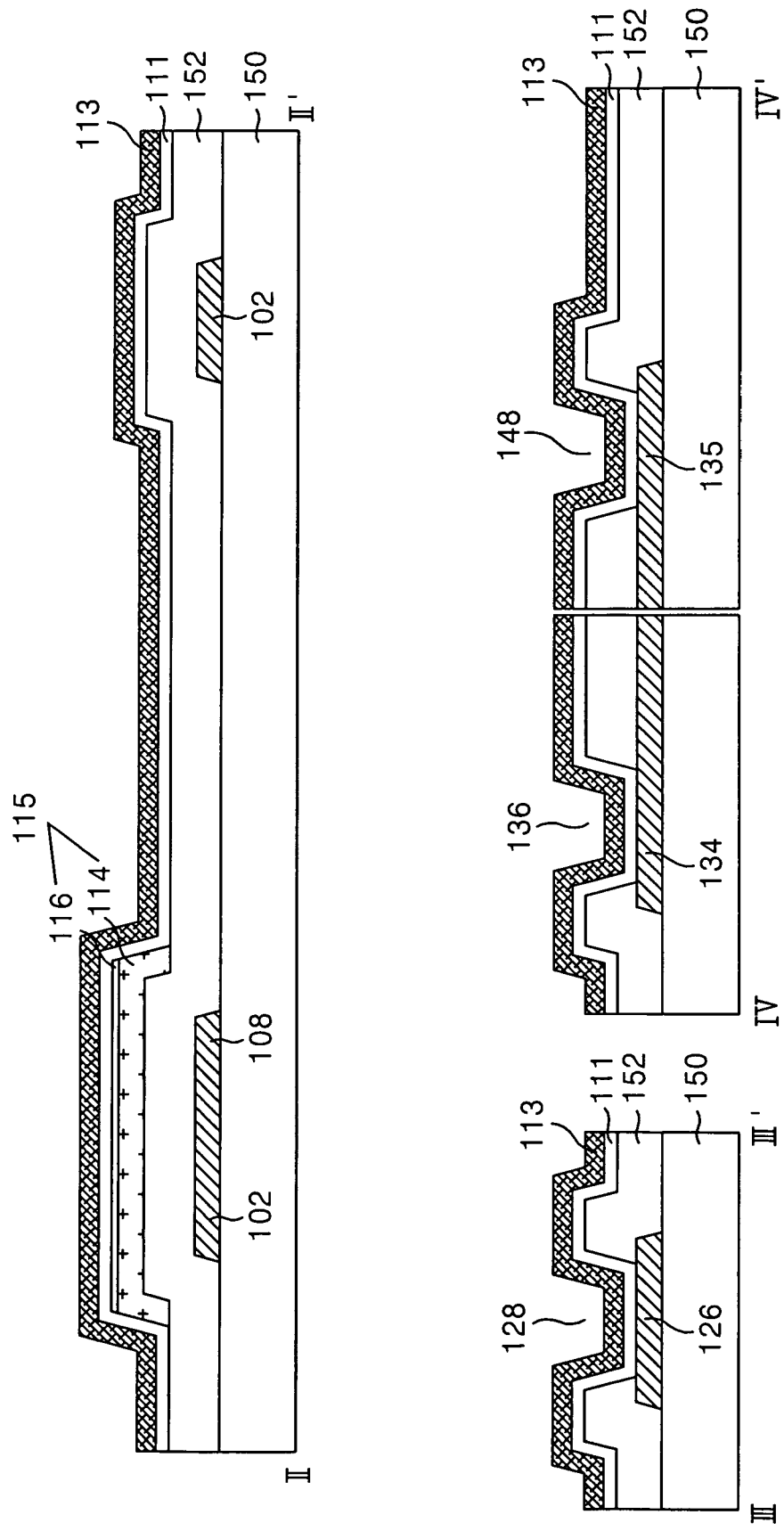

Specifically, the first and second conductive layers 111, 113 are sequentially formed on the gate insulating film 152 and the semiconductor pattern 115 as in FIG. 9A, by a deposition method such as sputtering. The first conductive layer 111 may be formed of a transparent conductive layer such as ITO, TO, IZO, ITZO, etc. The second conductive layer may be formed of Mo, Ti, Cu, AlNd, Al, Cr, Mo alloy, Cu alloy and Al alloy in a single layer, or may be formed in a double or multiple layer structure like Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, Al alloy/Mo alloy, Mo alloy/Al alloy and Mo/Al alloy.

Referring to FIG. 9B, a third photo-resist pattern 182 with a step difference is formed by a photolithography process using the halftone mask. The halftone mask includes: a shielding area for intercepting ultraviolet rays; a halftone transmission area for partially transmitting the ultraviolet rays by use of a phase shift material; and a transmission area for transmitting all the ultraviolet rays. There is formed a third photo-resist pattern 182 using an aperture area that includes photo-resist patterns 182A, 182B having different thicknesses from each other by the photolithography process using the halftone mask. The relatively thick photo-resist pattern 182A is formed in a shielding area P1 of the third photo-resist which overlaps the shielding area P1 of the halftone mask, the photo-resist pattern 182B that is thinner than the photo-resist pattern 182A is formed in a halftone exposure area P2 which overlaps the halftone transmission area, and the aperture area is formed in a full exposure area P3 that overlaps the transmission area.

Referring to FIG. 9C, the first and second conductive layers 111, 113 are patterned by an etching process using the third photo-resist pattern 182 as a mask, thereby forming the data line 104, the source electrode 110, the drain electrode 112, the pixel electrode 118, the gate pad upper electrode 130, and the data pad upper electrode 138 that have the double layer structure. The data line 104 overlaps the data link 135 to connect to the data link through the third contact hole 148. Herein, the second conductive layer 113 and the first conductive layer 111 are etched by different etchants, thus the lower first conductive layer 111 might be over-etched versus the upper second conductive layer resulting in an under-cut area. Subsequently, the ohmic contact layer 116 exposed through the source electrode 110 and the drain electrode 112 is removed by a dry etching process, thereby exposing the active layer 114 thereunder.

Figure 9D:
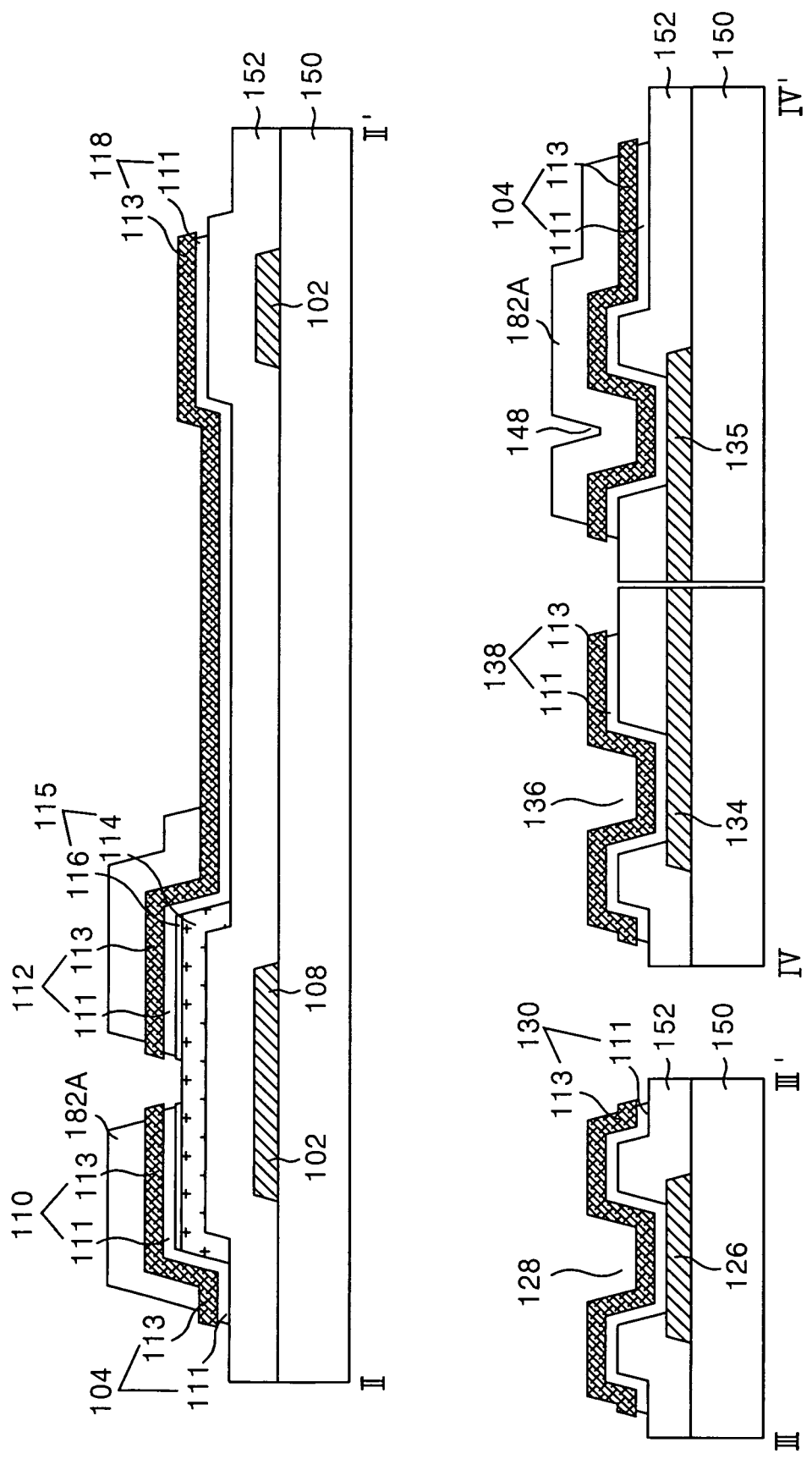

Referring to FIG. 9D, an ashing process thins the photo-resist pattern 182A and removes the photo-resist pattern 182B. The second conductive layer 113 of the pixel electrode 118, the gate pad upper electrode 130, and the data pad upper electrode 138 is exposed by the removal of the photo-resist pattern 182B. Further, the edge of the ashed photo-resist pattern 182A is located within the edge of the patterned second conductive layer 113.

Referring to FIG. 9E, the second conductive layer 113 of the pixel electrode 118, the gate pad upper electrode 130, and the data pad upper electrode 138 is etched by the etching process using the ashed photo-resist pattern 182A as a mask, thereby forming the pixel electrode 118, the gate pad upper electrode 130, the data pad upper electrode 138 in a single layer structure of the first conductive layer 111. At this time, both side areas of a second conductive layer 113 exposed at the edge area of the photo-resist pattern 182A are etched once more. Accordingly, the first and second conductive layers 111, 113 of the data line 104, the source electrode 110, and the drain electrode 112 have a uniform step difference in a step shape.

Referring to FIG. 9F, the photo-resist pattern 182A shown in FIG. 9E is removed by a stripping process.

As a result, the thin film transistor substrate according to the embodiment of the present invention has a structure where the data line 104, the source electrode 110, the drain electrode 112, and the pixel electrode 118 are exposed because of the absence of a passivation film, but they are all located in the area that are sealed by the sealant, thus they are sufficiently protected by the liquid crystal in the sealed area as well as by the lower alignment film formed thereover.

As described above, the thin film transistor substrate and the fabricating method thereof according to the present invention forms the semiconductor pattern and the contact hole by use of a first halftone (or diffractive exposure) mask.

Further, the thin film transistor substrate and the fabricating method thereof according to the present invention forms the pixel electrode and the pad upper electrodes of the single layer structure together with the third mask pattern group of a double layer structure without the passivation film by use of the second halftone (or diffractive exposure) mask.

Accordingly, the thin film transistor substrate according to the present invention simplifies the process to three mask processes, thereby enabling the reduction of material cost and equipment investment cost and improving the yield.

The liquid crystal display panel to which the thin film transistor substrate according to the present invention is applied has the data line, the source electrode, the drain electrode, and the pixel electrode exposed due to the absence of the passivation film protected by the alignment film spread thereover or the liquid crystal filled in the area which is sealed by the sealant. Further, the pads of the thin film transistor substrate are all made to have the same structure, and the data link connected to the data pad is formed to be connected to the data line through the contact hole within the area that is sealed by the sealant. Accordingly, it is possible to prevent an electrolytic corrosion problem caused by the absence of the passivation film.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   a gate line on a substrate;
   a data line crossing the gate line with a gate insulating film in between to define a pixel area;
   a thin film transistor having a gate electrode connected to the gate line, a source electrode connected to the data line, a drain electrode facing the source electrode, and a semiconductor pattern providing a channel between the source electrode and the drain electrode; and a pixel electrode in the pixel area connected to the drain electrode, wherein the data line, the source electrode, and the drain electrode are formed of a first conductive layer group of double conductive layers, the pixel electrode is formed of the lowermost layer of the extended drain electrode, and the data line, the source electrode, the drain electrode, and the pixel electrode are in an area that is to be sealed by a sealant.

2. The device according to claim 1, further comprising:
a storage capacitor formed by overlapping the pixel electrode with the gate line with the gate insulating film in between.

3. The device according to claim 1, wherein the first conductive layer group has a transparent conductive layer as a lowermost layer.

4. The device according to claim 1, further comprising:
a gate pad connected to the gate line; and
a data pad connected to the data line,
wherein each of the gate pad and the data pad includes:
a pad lower electrode formed together with the gate line on the substrate;
a contact hole penetrating the gate insulating film to expose the pad lower electrode; and
a pad upper electrode formed as a lowermost layer of the first conductive layer group to connect to the pad lower electrode through the contact hole.

5. The device according to claim 4, further comprising:
a data link extending from a lower electrode of the data pad to partially overlap the data line; and
a second contact hole penetrating the gate insulating film to connect the data line to the data link.

6. The device according to claim 5, wherein the second contact hole is in an area that is sealed by the sealant.

7. The device according to claim 5, further comprising:
an alignment film on the data line, the source electrode, the drain electrode, and the pixel electrode.

8. The device according to claim 7, wherein the second contact hole is located under the alignment film.

9. The device according to claim 1, wherein the semiconductor pattern is formed only in an area where the thin film transistor is to be formed.

10. The device according to claim 1, wherein the first conductive layer group has a step shape.

11. A method of fabricating a liquid crystal display device, comprising:
a first mask process of forming a first mask pattern group having a gate line and a gate electrode connected to the gate line on a substrate;
a second mask process of forming a gate insulating film to cover the first mask pattern group and a semiconductor pattern thereon; and
a third mask process of forming a third mask pattern group having a data line, a source electrode connected to the data line, a drain electrode facing the source electrode, and a pixel electrode on the gate insulating film where the semiconductor pattern is formed, so that the third mask pattern group is located in an area sealed by a sealant, wherein the data line, the source electrode, and the drain electrode have double conductive layers, and the pixel electrode has a single layer structure where the lowermost layer of the drain electrode is extended.

12. The method according to claim 11, further comprising:
forming an alignment film on the third mask pattern group.

13. The method according to claim 11, wherein
the first mask process further includes forming a pad lower electrode connected to at least one of the gate line and the data line;
the second mask process further includes forming a contact hole that penetrates the gate insulating film to expose the pad lower electrode; and
the third mask process further includes forming a pad upper electrode from the lowermost layer of the second conductive layer group to be connected to the pad lower electrode through the contact hole.

14. The method according to claim 13, wherein:
the first mask process includes forming a data link extending from the pad lower electrode to overlap the data line, and
the second mask process includes forming a second contact hole where the data link is connected to the data line.

15. The method according to claim 14, wherein the second mask process includes:
forming a gate insulating film, an amorphous silicon layer, and an amorphous silicon layer doped with impurities on the first mask pattern group;
forming a photo-resist pattern with different thicknesses by a photolithography process using at least one of a halftone mask and a diffractive exposure mask; and
forming the contact holes and the semiconductor pattern by an etching process using the photo-resist pattern.

16. The method according to claim 14, wherein the third mask process includes:
forming the first conductive layer group on the gate insulating film where the semiconductor pattern is formed;
forming a photo-resist pattern with different thicknesses using at least one of a halftone mask and a diffractive exposure mask;
forming a third mask pattern group having the pad upper electrode by patterning the first conductive layer group by the etching process using the photo-resist pattern;
removing the amorphous silicon layer doped with the impurities exposed through the source electrode and the drain electrode; and
etching the pad upper electrode by the etching process using the photo-resist pattern so as to leave only the lowermost layer thereof.

17. The method according to claim 16, wherein the first conductive layer group includes a transparent conductive layer as the lowermost layer.

18. The method according to claim 17, further comprising:
etching both side areas of an upper layer which are exposed by the photo-resist pattern so that an edge of the upper layer is located inside an edge of the lowermost layer, when the lowermost layer of the first conductive group is over-etched versus the upper layer when patterning the first conductive layer group.

19. The method according to claim 12, further comprising:
forming a storage capacitor by overlapping the pixel electrode with the gate line with the gate insulating film in between.

20. The method according to claim 15, wherein the second contact hole is formed in an area which is sealed by the sealant.

21. The method according to claim 14, wherein the second contact hole is under the alignment film.

22. The method according to claim 11, wherein the first conductive layer group has a step shape.

* * * * *